US012477964B2

(12) United States Patent
Simmons et al.

(10) Patent No.: US 12,477,964 B2
(45) Date of Patent: Nov. 18, 2025

(54) SYSTEMS, DEVICES, AND METHODS TO INTERACT WITH QUANTUM INFORMATION STORED IN SPINS

(71) Applicant: PHOTONIC INC., Coquitlam (CA)

(72) Inventors: Stephanie Simmons, Burnaby (CA); Michael L. W. Thewalt, Vancouver (CA)

(73) Assignee: PHOTONIC INC., Coquitlam (CA)

( * ) Notice: Subject to any disclaimer, the term of this patent is extended or adjusted under 35 U.S.C. 154(b) by 881 days.

(21) Appl. No.: 17/660,354

(22) Filed: Apr. 22, 2022

(65) Prior Publication Data

US 2022/0327411 A1    Oct. 13, 2022

Related U.S. Application Data

(63) Continuation of application No. 15/778,906, filed as application No. PCT/IB2016/001773 on Nov. 25, 2016, now Pat. No. 11,341,426.

(Continued)

(51) Int. Cl.
*H10N 99/00* (2023.01)
*B82Y 10/00* (2011.01)
(Continued)

(52) U.S. Cl.
CPC .............. *H10N 99/05* (2023.02); *B82Y 10/00* (2013.01); *G02B 6/12* (2013.01); *G02B 6/12007* (2013.01);
(Continued)

(58) Field of Classification Search
CPC ........ H10N 99/05; H10N 39/00; B82Y 10/00; G02B 6/12; G02B 6/12007; G02B 6/1225;
(Continued)

(56) References Cited

U.S. PATENT DOCUMENTS 6,369,404 B1 *  4/2002  Kane ...................... B82Y 10/00
                                                                 257/14
7,447,404 B2   11/2008  Miller
(Continued)

FOREIGN PATENT DOCUMENTS

CA        2849589 A1   10/2014
CN      102577225 A     7/2012
(Continued)

OTHER PUBLICATIONS

Sumikura, H. et al., "Ultrafast spontaneous emission of copper-doped silicon enhanced by an optical nanocavity", Sci. Rep. vol. 4:5040 pp. 1-6 (May 2014).
(Continued)

*Primary Examiner* — Lisa M Caputo
*Assistant Examiner* — Michael J Singletary
(74) *Attorney, Agent, or Firm* — Oyen Wiggs Green & Mutala LLP

(57) ABSTRACT

A quantum information processing device including a semiconductor substrate. An optical resonator is coupled to the substrate. The optical resonator supports a first photonic mode with a first resonator frequency. The quantum information processing device includes a non-gaseous chalcogen donor atom disposed within the semiconductor substrate and optically coupled to the optical resonator. The donor atom has a transition frequency in resonance with the resonator frequency. Also disclosed herein are systems, devices, articles and methods with practical application in quantum information processing including or associated with one or more deep impurities in a silicon substrate optically coupled to an optical structure.

20 Claims, 15 Drawing Sheets

Related U.S. Application Data

(60) Provisional application No. 62/260,391, filed on Nov. 27, 2015.

(51) Int. Cl.

| | | |
|---|---|---|
| *G02B 6/12* | (2006.01) | |
| *G02B 6/122* | (2006.01) | |
| *G02B 6/26* | (2006.01) | |
| *G02B 6/293* | (2006.01) | |
| *H10D 48/00* | (2025.01) | |
| *H10D 48/40* | (2025.01) | |
| *H10D 62/10* | (2025.01) | |
| *H10D 62/60* | (2025.01) | |
| *H10D 62/81* | (2025.01) | |
| *H10D 62/832* | (2025.01) | |
| *H10D 62/834* | (2025.01) | |
| *H10N 39/00* | (2023.01) | |

(52) U.S. Cl.
CPC .............. *G02B 6/1225* (2013.01); *G02B 6/26* (2013.01); *G02B 6/29341* (2013.01); *H10D 48/383* (2025.01); *H10D 48/385* (2025.01); *H10D 48/40* (2025.01); *H10D 62/118* (2025.01); *H10D 62/124* (2025.01); *H10D 62/126* (2025.01); *H10D 62/60* (2025.01); *H10D 62/814* (2025.01); *H10D 62/834* (2025.01); *H10N 39/00* (2023.02); *G02B 2006/12061* (2013.01); *H10D 62/832* (2025.01); *H10D 62/8325* (2025.01)

(58) Field of Classification Search
CPC ................. G02B 6/26; G02B 6/29341; G02B 2006/12061; H10D 48/383; H10D 48/385; H10D 48/40; H10D 62/118; H10D 62/124; H10D 62/126; H10D 62/60; H10D 62/814; H10D 62/834; H10D 62/832; H10D 62/8325; H10D 48/3835

See application file for complete search history.

(56) References Cited

U.S. PATENT DOCUMENTS

| | | | |
|---|---|---|---|
| 7,889,992 | B1 | 2/2011 | Divicenzo et al. |
| 8,022,722 | B1 | 9/2011 | Pesetski et al. |
| 9,350,460 | B2 * | 5/2016 | Paik .................... B82Y 10/00 |
| 9,928,827 | B1 | 3/2018 | El-Kady et al. |
| 2008/0063339 | A1 | 3/2008 | Spillane et al. |
| 2008/0128713 | A1 * | 6/2008 | Saito .................... H10H 20/826 438/22 |
| 2010/0108986 | A1 | 5/2010 | Fuertes Maron et al. |
| 2010/0282948 | A1 * | 11/2010 | Miyajima ............. H10F 30/225 257/E31.037 |
| 2013/0049036 | A1 | 2/2013 | Jeong |
| 2013/0107253 | A1 | 5/2013 | Santori et al. |
| 2013/0107352 | A1 | 5/2013 | Santori et al. |
| 2014/0025926 | A1 | 1/2014 | Yao et al. |
| 2014/0314419 | A1 | 10/2014 | Paik |
| 2014/0361249 | A1 | 12/2014 | Lee et al. |
| 2015/0060756 | A1 | 3/2015 | Park |

FOREIGN PATENT DOCUMENTS

| | | |
|---|---|---|
| TW | 423028 B | 2/2001 |
| TW | 423046 B | 2/2001 |
| WO | 9956392 A2 | 11/1999 |
| WO | 9956393 A1 | 11/1999 |
| WO | 2008074298 A1 | 6/2008 |
| WO | 2010024724 A2 | 3/2010 |

OTHER PUBLICATIONS

Abanto, M. et al., "Quantum computation with doped silicon cavities", Phys. Rev. B, vol. 81, 085325 (2010).

Steger, M. et al., "Photoluminescence of deep defects involving transition metals in Si: New insights from highly enriched 28Si", J. Appl. Phys. vol. 110, 081301 (2011).

Lynch, S. A. et al., "Infrared Single Photon Centers in Chalcogen Doped Silicon for Quantum Computing", Proc. 2014 EEE Intern. Semicon. Laser Conf. (2014).

Nardo, R. L., "Charge state manipulation of silicon-based donor spin qubits", Thesis, Univ. Oxford (Hilary Term Jan.-Mar. 2015).

Du, L. et al., "Fabrication and infrared absorption of tellurium doped silicon via femtosecond-laser irradiation", Proc. SPIE, vol. 9686 (2016).

Abuelgasim, A. et al., "Fabrication of low loss coplanar waveguides on gold-doped Czochralski-silicon", Proc. SPIE vol. 8068 (2011).

Willander, M., "Surface Recombination Velocity in a Silicon Optical Waveguide", Appl. Phys. A, vol. 31, pp. 45-49 (1983).

Schuster, D. I. et al., "High-Cooperativity Coupling of Electron-Spin Ensembles to Superconducting Cavities", Physical Review Letters vol. 105, 140501 (2010).

Seigneur, H. P. et al., "Controlled On-Chip Single Photon Transfer Using Photonic Crystal Coupled-Cavity Naveguides", Adv. Optoelectron., vol. 2011, article 893086 (2011).

Steger, M et al., "High-resolution absorption spectroscopy of the deep impurities S and Se in 28Si revealing the 77Se hyperfine splitting", Phys. Rev. B., vol. 80(11) article 115204 (2009).

Radulaski, M. et al., "Photonic Crystal Cavities in Cubic Silicon Carbide", Proc CLEO 2014, paper SM4M.4 (2014).

Togan, E. et al., "Quantum entanglement between an optical photon and a solid-state spin qubit", Nature, vol. 466 (Aug. 2010).

Yale, C. G. et al., "All-optical control of a solid-state spin using coherent dark states", PNAS, vol. 110, No. 19 (May 2013).

Kim, D. et al., "Ultrafast optical control of entanglement between two quantum dot spins", Nature Physics 7, 223-229 (2011).

St-Jean, P., "Dynamics of Excitonic Complexes Bound to Isoelectronic Centers: Toward the Realization of Optically Addressable Qubits", Ecole Polytechnique de Montreal, Thesis (Sep. 2016).

Dutt, G. et al., "Quantum Register Based on Individual Electronic and Nuclear Spin Qubits in Diamond", Science 316. 1312 (Jul. 2007).

Peale, R. E. et al., "Zeeman splitting of double-donor spin-triplet levels in silicon", Phys. Rev. B., vol. 37(18), pp. 10829-10837 (Jun. 1988).

Weber, J. et al., "Optical properties of copper is silicon: Excitons bound to isoelectronic copper pairs", Phys. Rev. B., vol. 25(12), pp. 7688-7699 (Jun. 1982).

Tosi, G. et al., "Circuit-quantum electrodynamics with direct magnetic coupling to single-atom spin qubits in sotopically enriched 28Si", AIP Advances 4, 087122, 2014.

PUBCHEM webpage for copper-63 (32 pages) (no date).

Ruskov, R. et al., "On-chip cavity quantum phonodynamics with an acceptor qubit in silicon", Phys. Rev. B., vol. 88 064308 (2013).

* cited by examiner

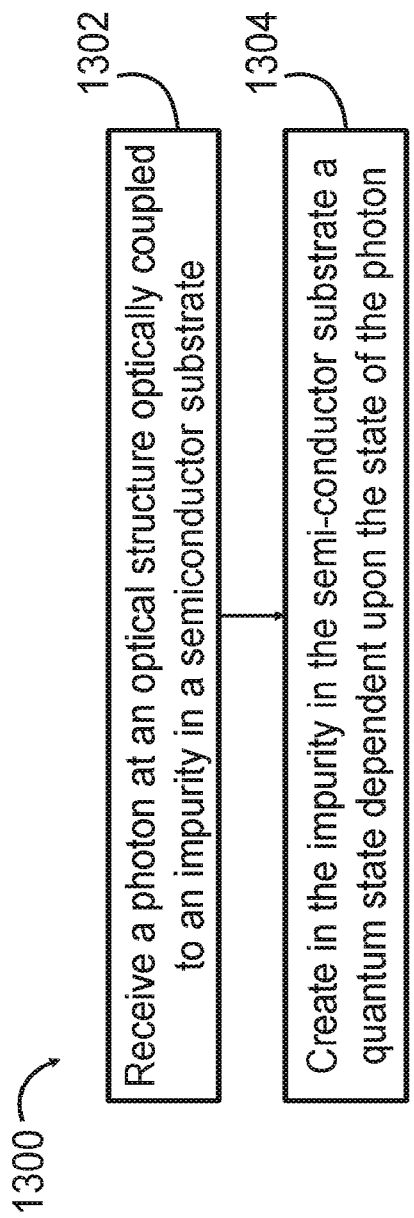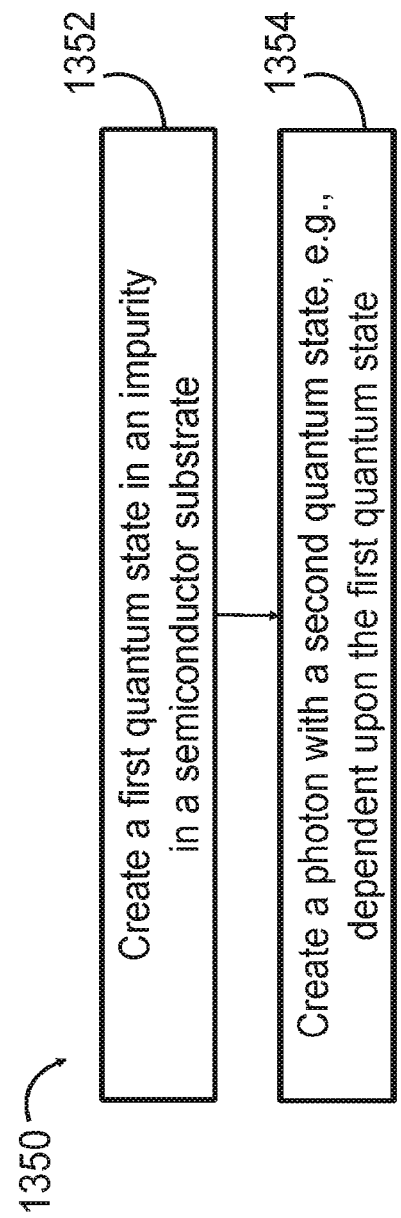

SYSTEMS, DEVICES, AND METHODS TO INTERACT WITH QUANTUM INFORMATION STORED IN SPINS

CROSS REFERENCE TO RELATED APPLICATION

This application is a continuation of U.S. patent application Ser. No. 15/778,906 filed on 24 May 2018, which is a 371 of PCT Patent Application No. PCT/IB2016/001773 filed on 25 Nov. 2016, which claims priority from U.S. Patent Application No. 62/260,391 filed on 27 Nov. 2015 entitled "SYSTEMS, DEVICES, AND METHODS FOR INTERACTING WITH QUANTUM INFORMATION STORED IN SPINS". For purposes of the United States of America, this application claims the benefit under 35 U.S.C. § 119 of U.S. Patent Application No. 62/260,391 filed on 27 Nov. 2015 entitled "SYSTEMS, DEVICES, AND METHODS FOR INTERACTING WITH QUANTUM INFORMATION STORED IN SPINS" which is incorporated by reference herein in its entirety.

BACKGROUND

Technical Field

This disclosure generally relates to the fields of quantum computing and quantum information.

Description of the Related Art

Quantum devices are manufactures or structures in which quantum mechanical effects are noticeable and/or dominate. Quantum devices (such as superconducting circuits and spintronic circuits) include circuits in which current transport is dominated by quantum mechanisms. Superconducting circuits use quantum physics phenomena such as tunneling and flux quantization. Spintronic circuits use the physical property of spin (e.g. electron spin) as a resource to receive, process, store, send, or output information. Quantum devices can be used for measurement instruments, in computing machinery, and the like. Examples of computing machinery include components of classical computers and quantum computers.

A proposed technique for implementing a quantum computer describes an electronic device where information is encoded in nuclear spins of donor atoms (specifically, phosphorus-31) placed in a silicon substrate. The donor atoms are placed at a shallow depth (e.g., 20 nanometers) and precisely spaced apart (e.g., at about 20 nanometers) with a precision of one crystal unit cell in the silicon substrate. Logical or computing operations on individual spins are performed using externally applied electromagnetic fields, and spin measurements are made using spin-dependent charge transfer, and detected using highly sensitive electrometers. The proposed technique has not been fully realized.

BRIEF SUMMARY

A technique of implementing a quantum computer involves a quantum information processing device. The quantum information processing device includes a semiconductor substrate. Deep impurities (e.g. non-gaseous chalcogen donor atoms) are disposed within the semiconductor substrate. Each of the deep impurities (e.g. non-gaseous chalcogen donor atoms) is characterized by a plurality of quantum states corresponding to different electron or nuclear spin states of the deep impurity and representing qubit information. The quantum information processing device further includes a first optical resonator having a first photonic mode with a first resonator frequency and an optical state representing resonator information. The first optical resonator optically couples the qubit information and the resonator information.

A method of operation for a quantum information processor. The quantum information processor includes an optical structure coupled to a semiconductor substrate. A plurality of deep impurities is disposed in the semiconductor substrate. Each of the deep impurities is characterized by a plurality of quantum states corresponding to different electron and nuclear spin states of the donor atom, information being represented by the quantum states of the deep impurity (e.g., donor atom). The method includes initializing a first deep impurity in the plurality of deep impurities to a first fiducial state, and initializing a second deep impurity in the plurality of deep impurities to the first fiducial state. The method further involves causing an optical resonator proximate to the first donor atom and the second donor atom, to be in resonance with the first donor atom and the second donor atom, and measuring an optical state of the optical resonator as a measure of the information represented by the quantum states of the first donor atom and the second donor atom.

Another method of operation for a quantum information processor including a donor atom implanted in a semiconductor substrate. The method includes initializing the donor atom in a fiducial state and applying a pulsed magnetic field to the first donor atom to change states, causing an optical resonator proximate to the donor atom to be in resonance with the donor atom, and measuring a presence or absence of a photon in the optical resonator.

Another method of operation for a quantum information processor including a non-gaseous chalcogen donor atom disposed in a semiconductor substrate. The non-gaseous chalcogen donor atom is characterized as having one or more different quantum states representing information. In one aspect, the method includes receiving a photon with a first quantum state at an optical resonator optically coupled to the non-gaseous chalcogen donor atom and creating a second quantum state in the non-gaseous chalcogen donor atom corresponding to the first quantum state at the optical resonator.

In another aspect, the method includes creating a first quantum state in the non-gaseous chalcogen donor atom in the semiconductor substrate, and optically coupling the non-gaseous chalcogen donor atom to an optical resonator. The method also includes creating, at an optical resonator, a photon with a second quantum state corresponding to the first quantum state in the non-gaseous chalcogen donor atom.

A system including a digital computer and an analog computer substantially as described and illustrated herein.

A system including a quantum information processor substantially as described and illustrated herein. The quantum information processor includes a semiconductor substrate, a first non-gaseous donor atom implanted in the substrate, a second non-gaseous donor atom implanted in the substrate, and an optical structure defined in the substrate, and otherwise substantially as described and illustrated herein.

A quantum information processor substantially as described and illustrated herein.

A quantum information storage device substantially as described and illustrated herein.

A method of operation for a system including a digital computer and an analog computer substantially as described and illustrated herein.

A method of operation for a quantum information processor substantially as described and illustrated herein.

BRIEF DESCRIPTION OF THE SEVERAL VIEWS OF THE DRAWINGS

Systems, devices, articles, and methods are described in greater detail herein with reference to the following figures in which:

FIGS. 13A and 13B are flow diagrams illustrating methods for interconversion of a flying qubit and a stationary qubit;

DETAILED DESCRIPTION

Disclosed herein are systems, devices, articles, and methods with practical application in quantum information processing, e.g., quantum computing, and quantum communication. Some implementations of the present systems, devices, articles and methods include, or are characterized by, two or more of the following aspects of a quantum computer: well-defined qubits, reliable state preparation, low decoherence rates, accurate quantum gate operations, multi-qubit coupling, and strong quantum measurements. The systems, devices, articles and methods, with practical application in quantum communication and quantum computing, can interconvert states in stationary qubits (e.g., solid state) and flying qubits (e.g., photons).

Figure 1:
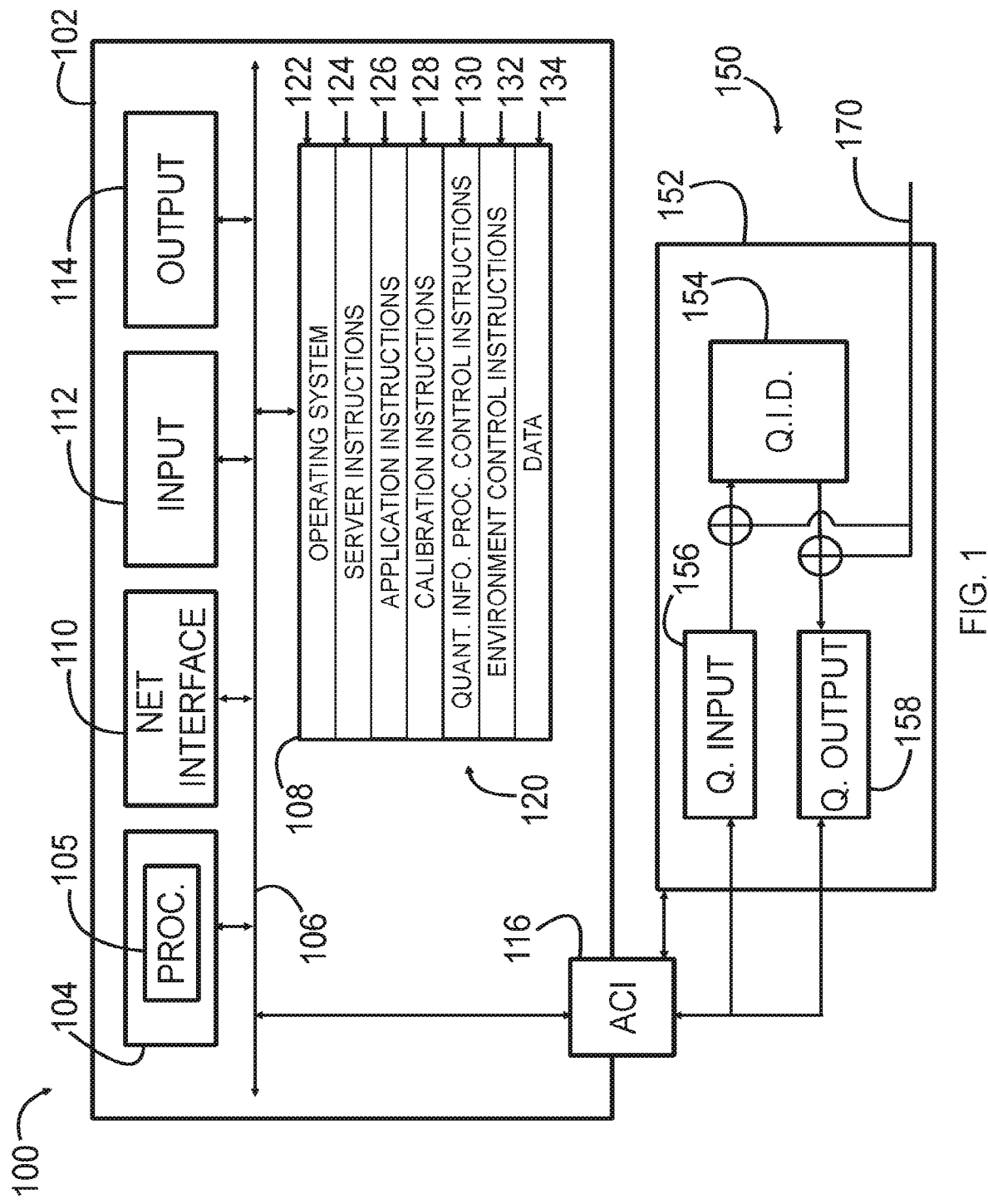
FIG. 1 is a schematic diagram illustrating a portion of a system including a quantum information processor.

FIG. 1 illustrates a computer system 100 including specialized devices to process information. System 100 includes a digital computer 102 that comprises a control subsystem 104. Control subsystem 104 includes at least one processor 105. Digital computer 102 includes a bus 106 coupled to control subsystem 104. System 100 includes at least one non-transitory computer- and processor-readable storage device 108, and network interface subsystem 110, both communicatively coupled to bus 106. The digital computer 102 includes an input subsystem 112, and an output subsystem 114, communicatively coupled to the bus 106. Digital computer 102 includes an analog computer interface subsystem 116 coupled to bus 106. In various implementations, bus 106 communicatively couples pairs of subsystem and/or all the subsystems in computer 102. In some implementations, some subsystems of system 100 are omitted or combined.

The at least one processor 105 may be any logic processing unit, such as one or more digital processors, microprocessors, central processing units (CPUs), graphics processing units (GPUs), application-specific integrated circuits (ASICs), programmable gate arrays (PGAs), programmed logic units (PLUs), digital signal processors (DSPs), network processors (NPs), and the like.

Network interface subsystem 110 comprises communication circuitry to support bidirectional communication of processor-readable data, and processor-executable instructions. The network interface subsystem 110 employs communication protocols (e.g., FTP, HTTPS, SSH, TCP/IP, SOAP plus XML) to exchange processor-readable data, and processor-executable instructions over a network or non-network communication channel (not shown) such as, Internet, a serial connection, a parallel connection, ETHERNET®, wireless connection, fiber optic connection, combinations of the preceding, and the like.

Input subsystem 112 includes one or more user interface devices such as keyboard, pointer, number pad, touch screen. In some implementations, input subsystem 112 includes one or more sensors for digital computer 102 or analog computer 150. The one or more sensors provide information characterizing or representing the environment or internal state of digital computer 102 and/or analog computer 150. Output subsystem 114 includes one or user interface devices such as, display, lights, speaker, and printer.

Storage device(s) 108 is at least one nontransitory or tangible storage device. Storage device(s) 108 can, for example, include one or more volatile storage devices, for instance random access memory (RAM); and one or more non-volatile storage devices, for instance read only memory (ROM), flash memory, magnetic hard disk, optical disk, solid state disk (SSD), and the like. A person of ordinary skill in the art will appreciate that storage may be implemented in a variety of ways, such as, read only memory (ROM), random access memory (RAM), hard disk drive (HDD), network drive, flash memory, other forms of computer- and processor-readable storage media, and/or a combination thereof. Storage can be read-only or read-write. Further, modern computer systems conflate volatile storage and non-volatile storage, for example, caches, solid-state hard drives, in-memory databases, and the like.

Storage device(s) 108 includes or stores processor-executable instructions and/or processor-readable data 120 associated with the operation of system 100. Execution of processor-executable instructions and/or data 120 causes the at least one processor 105, and/or control subsystem 104, to carry out various methods and actions, for example by network interface subsystem 110, or analog computer interface subsystem 116. Processor(s) 105 can cause system 100 to carry out methods and actions. Processor-executable instructions and/or processor-readable data 120 can, for example, include a basic input/output system (BIOS)(not shown), an operating system 122, peripheral drivers (not shown), server instructions 124, application instructions 126, calibration instructions 128, quantum information processor control instructions 130, environment control instructions 132, and processor-readable data 134.

Exemplary operating system 122 can include LINUX®, WINDOWS®. Server instructions 124 include processor-executable instructions and/or processor-readable data to interact with external computers to system 100 across a network via the network interface subsystem. In some embodiments, processor-executable server instructions 124 include processor-executable instructions and/or processor-readable data that, when executed by a processor, schedules jobs for digital computer 102 or analog computer 150. Application instructions 126 include processor-executable instructions that, when executed, causes system 100 to perform at application, e.g., perform computations on digital computer 102 or analog computer 152.

Calibration instructions 128 include processor-executable instructions, that, when executed by a processor (e.g., processor 105) cause the processor to calibrate and store the calibrated values for analog computer 150. Components included in or on analog computer 150 could have inter-component variation in operating parameters. Calibration instructions 128, when executed by a processor, allow for test and correction of these inter-component variation and/or variation from expected or ideal component parameters.

Quantum information processor control instructions 130 include processor-executable instructions that, when executed by a processor (e.g., processor 105) cause the processor to control, initialize, write to, manipulate, read out, and/or otherwise send data to/from analog computer 150. Quantum information processor control instructions 130 implement, in part, the methods described herein.

Environment control instructions 132 includes processor-executable instructions and/or processor-readable data, that, when executed by a processor (e.g., processor 105), cause the processor to control and monitor aspects of prescribed and possibly specialized environments for part or all of analog computer 150. Examples of such instructions 132 include instructions to monitor and control temperature and magnetic field affecting a quantum information processor. Environment control instructions 132 implement, in part, the methods described herein, including those in and in relation to FIG. 10, etc.

Data 134 include data used or obtained by the operation of system 100. For example, one or more logs from digital computer 102 and analog computer 150. Data 134 include data associated with (e.g., created by, referred to, changed by) a processor executing processor-executable instructions, such as, server instructions 124, application instructions 126, calibration instructions 128, quantum information processor control instructions 130, and environment control instructions 132.

Analog computer interface (ACI) subsystem 116 comprises communication circuitry supporting bidirectional communication between digital computer 102 and analog computer 150. In some implementations, analog computer interface subsystem 116 interacts with an environment subsystem 152 of analog computer 150. In some implementations, analog computer interface subsystem 116 interacts with quantum information processor 154 via one or more subsystems of analog computer 150 (e.g., subsystems 156 and 158). In various implementations, ACI subsystem 116 includes a waveform digitizer, such as an ALAZARTECH ATS9440, a 4-channel, 14 bit, 125 MS/s card, or an ALAZARTECH ATS9360, a 1-channel, 12 bit, 1.8 GS/s PCI card, card from Alazar Technologies Inc. of Pointe-Claire, QC, CA.

Analog computer 150 includes an environment subsystem 152 providing a prescribed environment for quantum information processor 154. Aspects of a prescribed environment may include, for example, one or more of moisture, air pressure, vibration, magnetic field, temperature, and electromagnetic fields. In some implementations, environment subsystem 152 provides a low magnetic field around quantum information processor 154. In some implementations, environment subsystem 152 provides a time invariant magnetic field around quantum information processor 154. In some implementations, environment subsystem 152 provides a time varying or pulsed magnetic field. In some implementations, environment subsystem 152 maintains the quantum information processor 154 at cryogenic temperatures via one or more refrigeration units, and/or cold sources. For example, quantum information processor 154 may be maintained near 4 K. Other useful temperatures for quantum information processor 154 include temperatures in a range from about 100 mK to about 77 K. In some implementations, environment subsystem 152 maintains the environment around quantum information processor 154 has a temperature of about 290 K. In some implementations, environment subsystem 152 includes vibration isolation devices including dampeners in refrigeration units. In some implementations, environment subsystem 152 provides a low moisture and constant air pressure (e.g., a stable mild vacuum) environment to quantum information processor 154.

Quantum information processor 154 includes one or more qubits. A qubit or quantum bit is a logical building block of a quantum computer comparable to a binary digit in a classical digital computer. A qubit conventionally is a defined physical system having two or more discrete states called computational states or basis states. Basis states logically are analogous to binary states. These states may be labeled $|0\rangle$ and $|1\rangle$. In some implementations, these states are the eigenstates of a sigma-Z operator (Pauli matrix operator) for the physical system. Such qubits are said to be in the Z diagonal basis. A qubit may be in a superposition of states, e.g., $\alpha|0\rangle + \beta|1\rangle$. Coefficients $\alpha$ and $\beta$ may be complex numbers. One or more logical operations can be performed on one or more qubits. These operations can occur at a prescribed time, (e.g., at a specified time) or at a frequency for a prescribed period.

In some implementations, quantum information processor 154 includes one or more devices or subsystems to perform one or more types of single qubit operations on one or more qubits. Examples of a one-qubit operation include the sigma-X or bit flip operation, comparable to a classical NOT gate. A sigma-X operation effects a rotation of a quantum state modelled as a Bloch Sphere around the X-axis. When the rotation is $\pi$ radians, state $|0\rangle$ is mapped to $|1\rangle$ and vice versa, i.e., a full bit flip. In some examples of quantum information processor 154 may perform on one or more qubits a sigma-Y operation, having no classical binary counterpart. A sigma-Y operation effects a rotation around the Y-axis. If the rotation is $\pi$ radians the operation maps state $|0\rangle$ to $|1\rangle$ and $|1\rangle$ to $-i|0\rangle$. The sigma-Y operation is sometimes called Pauli-Y operation or gate. In some examples of quantum information processor 154 may perform on one or more qubits a sigma-Z, or phase operation, having no classical counterpart. A sigma-Z operation effects a rotation around the Z-axis. If the rotation is $\pi$ radians the operation maps $|0\rangle$ to $|0\rangle$ and $|1\rangle$ to $-|1\rangle$. The sigma-Z operation is sometimes called a phase-flip or bias operation or gate.

In some implementations, quantum information processor 154 includes one or more couplers that can couple qubits. A two qubit coupling operation may be a selective operation. A two qubit coupling operation may be performed on a first and a second qubit. An example of a two qubit coupling operation is a CNOT gate where two qubits are taken as input and the output state of a first qubit is the NOT of the first qubit's input state conditional on the state of the second qubit's input state. Other examples of a two qubit coupling operation is an Ising coupling, diagonal coupling, or sigma-Z sigma-Z coupling. In quantum information processor 154, qubits can be communicatively coupled to one another through a number of structures and devices. In some implementations, qubit-qubit interactions are mediated via a single coupler included in quantum information processor 154. In some implementations, qubit-qubit interactions are mediated via multiple couplers. In some implementations, the quantum information processor 154 couples three or more qubits. Quantum information processor 154 includes as couplers one or more optical structures. Quantum information processor 154 may include as couplers one or more optical resonators, and/or one or more waveguides.

Analog computer 150 includes a quantum input subsystem 156 to write to, and manipulate, quantum information processor 154. In some implementations, quantum input subsystem 156 includes a digital to analog converter. In some implementations, quantum input subsystem 156 includes a light source to apply narrow or broad spectrum light to parts of quantum information processor 154. In some implementations, quantum input subsystem 156 includes an electromagnet to provide a magnetic field to parts or all of quantum information processor 154. In some implementations, quantum input subsystem 156 includes one or more emitters (e.g., wires, antennae, coils) to selectively provide control pulses for one or more times, durations, and frequencies to quantum information processor 154. Example of a pulse generator is a PSPL10070A™ available from Tektronix, Inc. of Beaverton, OR, US. In some implementations, the emitters are on quantum information processor 154. In some implementations, the emitters are proximate to quantum information processor 154 and coupled to devices on it. Microwave, RF, and/or electromagnetic control pulses may be used. In some implementations, quantum input subsystem 156 in conjunction with control subsystem 104 is used to perform electron paramagnetic resonance (EPR) and/or nuclear magnetic resonance (NMR) on electronic and/or nuclear spins in quantum input subsystem 156. In some implementations, a bulk EPR or NMR cavity surrounds the quantum information processor 154.

In some implementations, quantum input subsystem 156 includes wires electrically (e.g., galvanically) coupled to one or more electrodes, or pairs of electrodes included in quantum information processor 154. In some implementations, quantum input subsystem 156 applies DC and AC currents to electrically bias and control quantum information processor 154 from quantum input subsystem 156. For example, quantum input subsystem 156 may inject or remove carriers (e.g., electrons, and holes) from one or more parts of quantum information processor 154. Or, in some examples, provide a static or oscillating electrical or magnetic fields. DC currents and voltages may be provided by low noise power sources such as battery-powered voltage sources. The currents and voltages may be applied through resistive voltage dividers/combiners. AC currents and voltages may be applied to parts of quantum information processor 154 using an arbitrary waveform generator or signal generator, such as, a TELEDYNE LECROY ARB STUDIO 1104™, available from Teledyne Technologies, Inc. of Thousand Oaks, CA, US. AC currents and voltages for electron spin resonance (ESR) may be applied to parts of quantum information processor 154 using a signal generator, such as, an AGILENT E8257D™ microwave analog signal generator, available from Agilent Technologies of Santa Clara, CA, US. Lines leading from and/or to quantum information processor 154, including those shown in FIG. 1, may include filters, e.g., low pass, band pass, and high pass filters.

Analog computer 150 includes a quantum output subsystem 158 to manipulate and read from quantum information processor 154. In some implementations, quantum output subsystem 158 includes an analog to digital converter. In some implementations, quantum output subsystem 158 includes an optical readout device or devices. An optical readout device detects photons produced by, or in, the quantum information processor 154 or measures the state of an optical structure included on, or in, quantum information processor 154. An optical structure, such as a resonator, supports one or more photonic modes. Examples of optical structures are described herein. In some implementations, optical readout device(s) distinguishes between the presence, or absence, of one or more photons in the optical resonator. In some examples, optical readout device(s) detects a frequency shift for one or more photonic modes of an optical structure. One optical readout device may readout the state of one or more optical resonators. The state of an optical structure can be dependent on the state of a deep impurity (e.g., donor atom) coupled to the optical structure. Examples of deep impurities are described herein.

In some implementations, digital computer 102 uses quantum output subsystem 158 to perform logical operations on information in quantum information processor 154. For example, quantum output subsystem 158 may be used to perform measurements on quantum information processor 154. In some implementations, including a strong quantum measurement device, such as, examples described herein in relation to at least FIG. 7, measurements can replace one or more quantum operations. Universal quantum computing can be accomplished using only local gates and nonlocal (e.g., parity) measurements.

In some implementations, quantum output subsystem 158 performs single shot readout on the state of components in quantum information processor 154. In some implementations, quantum output subsystem 158 performs readout on the state of components in quantum information processor 154 at gigahertz speed.

In some implementations, analog computer 150 is communicatively coupled to a quantum information channel 170. The quantum information channel 170 can be used to send quantum information to and from quantum information processor 154. In some implementations, portions of digital computer 102 and analog computer 150 are omitted to create a smaller information processing device including quantum information processor 154, and quantum information channel 170.

Figure 2:
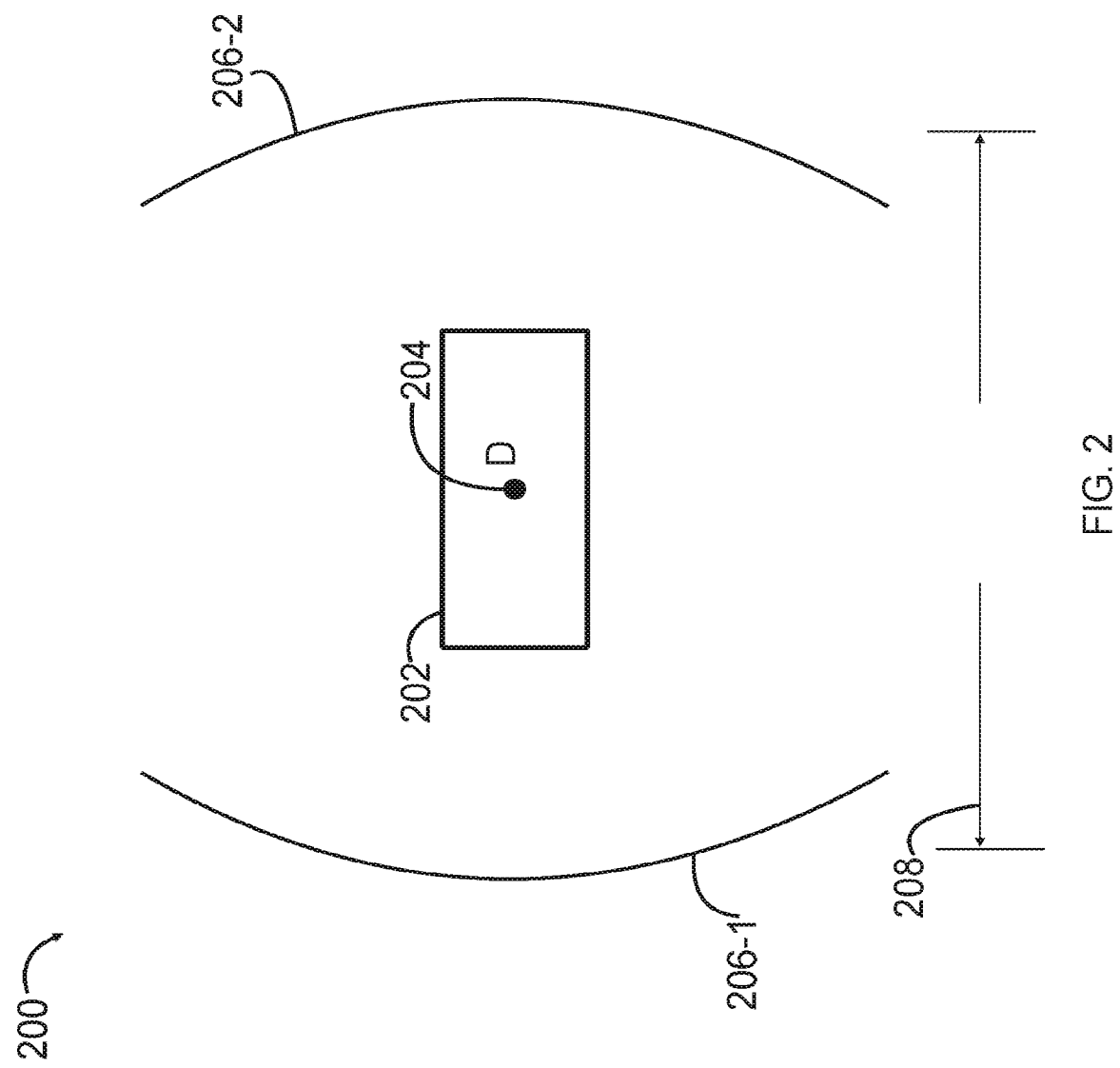
FIG. 2 is a schematic diagram illustrating an exemplary donor atom and resonator.

FIG. 2 is a schematic diagram illustrating a part of a quantum information processor 200. The illustrated part of quantum information processor 200 includes a substrate of semiconductor material 202, an exemplary donor atom 204 placed (e.g., implanted) within the semiconductor material 202, and optical resonator 206 communicatively coupled to the exemplary donor atom 204.

In some implementations, semiconductor material 202 is silicon. In some implementations, semiconductor material 202 is natural silicon. In some implementations, semiconductor material 202 is purified non-paramagnetic silicon. Semiconductor material 202 include silicon carbide or silicon germanium. One way to increase performance metrics for a physical system (e.g., longer coherence time for a system such as quantum information processor 200) is to use a semiconductor material with a large fraction of non-paramagnetic nuclei. Natural silicon consists of about 95% non-paramagnetic nuclei (92.2% silicon-28 and 3.1% silicon-30) and can be purified to remove some to nearly all non-zero-nuclear spin isotopes, such as, silicon-29.

These stable isotopes can be separated by creating silicon tetrafluoride ($SiF_4$) gas and then applying centrifuge or effusion based techniques to separate the isotopes. Using isotopically purified silicon tetrafluoride, and/or isotopically purified silane ($SiH_4$) produced from the silicon tetrafluoride, wafers and crystals of isotopically purified silicon may be created using, amongst other methods, molecular beam epitaxy (MBE), chemical vapor deposition (CVD), and the like. Suitable semiconductor material 202 may be purchased from Isoflex USA, an isotope supply company, of San Francisco, CA, US.

Donor atom 204 is disposed within the bulk of semiconductor material 202. Donor atom 204 is, in some implementations, implanted, deposited, or placed deep within the bulk or mass of semiconductor material 202. In at least one implementation, the placement is shallower. For example, a plurality of interfaces (e.g., faces, side, or edges) define extents for semiconductor material 202. In some implementations, donor atom 204 is disposed at a distance greater than 10 nanometers from each interface of the plurality of interfaces. In some implementations, donor atom 204 is evanescently coupled to an optical structure (e.g., resonator, waveguide, lens) and is position at shallow depth (e.g., nanometers) within semiconductor material 202. In some implementations, donor atom 204 is disposed at a distance greater than 20 nanometers from each interface of the plurality of interfaces. In some implementations, donor atom 204 is disposed at a distance greater than 30 nanometers from each interface of the plurality of interfaces. In some implementations, donor atom 204 is disposed at a distance between 30 nanometers and 500 nanometers from each interface of the plurality of interfaces. In some implementations, donor atom 204 is disposed at a distance between 10 nanometers and 2 microns from each interface of the plurality of interfaces. In some implementations, donor atom 204 is disposed at a distance between 30 nanometers and 1 micron from each interface of the plurality of interfaces. The deeper the position, the further the donor is away from charges that may reside on the interfaces.

Type of donor and implantation method vary with implementation. Semiconductor industry standard technique of ion implantation may be used to controllably implant donor atom 204 into semiconductor material 202. One implanting process is described in U.S. Pat. No. 3,434,894. In some implementations, donor atom 204 is a stable, non-gaseous, chalcogen atom. That is, long lived, metallic and non-metallic solids, group 16 atoms with a substitutional double-donor electronic structure in silicon. Examples include sulfur, selenium, and tellurium. In some implementations, the particular isotopes are used. Examples include sulfur-33, selenium-77, tellurium-123, and tellurium-125. Suitable isotopes may be purchased from Isoflex USA. In some implementations, the donor atom 204 is a "deep level impurity" or "deep level donor" with an ionization energy that is substantially greater than the thermal energy, $k_B T$, where $k_B$ is Boltzmann's constant and the temperature T is the room temperature (~293 K). A shallow donor's energy is comparable to the thermal energy at room temperature. Herein "shallow" and "deep" are used in two senses: one, to qualify an energy of one or more donor atoms; and two, to qualify a spatial location of one or more donor atoms. To a person of ordinary skill in the art these different meanings are apparent in each individual appearance especially in light of context, such as, "energy", "level", "spectra" versus "dispose", "place", "location", and the like.

Donor atom 204 in semiconductor material 202 defines part or all of a qubit. In some implementations, donor atom 204 in semiconductor material 202 includes two states with differing magnetic spin values. In some implementations, donor atom 204 has a first state corresponding to spin down $|\downarrow\rangle$. In some implementations, this is labeled as $|0\rangle$, a logical state of a qubit comparable to "0" in a bit. In some implementations, donor atom 204 has a second state corresponding to spin up $|\uparrow\rangle$. This may be labeled as $|1\rangle$, a logical state of a qubit comparable to "1" in a classical bit. Examples of quantum states for donor atoms are shown and described herein at, at least, FIG. 8 or 14.

In some implementations, the donor atoms operate up to about 100 gigahertz. That is, the manipulation of the donor electron or nuclear spin can be accomplished using driving frequencies corresponding to the energy splitting of these states, which are frequencies of up to about 100 gigahertz. In some implementations, a Hamiltonian describing donor atom 202 includes a transverse single qubit term (e.g., sigma-X term) with magnitude correlated with frequencies up to about 100 gigahertz. The transverse single qubit term is a bit flip, i.e. operates on the first state to produce the second state and vice versa.

In some implementations, donor atom 204 has a spin-selective transition. In some implementations, donor atom 204 has optical electric transition dipole moment ($\mu$) of about 1 Debye (or about $3\times10^{-30}$ C m) which is a stronger transition dipole value than some free-space atoms. The atom's transition dipole moment $\mu$, placed within a matching optical structure (e.g., resonator 206) with a local electric field E including an aligned part of electric field E, gives rise to a resonator coupling strength proportional to the product of the transition dipole moment and the aligned part electric field. In some implementations, donor atom 204 has one more transitions in convenient wavelength corresponding to wavelength of commercially available optical emitters, lasers, detectors, mirrors, and the like. In some implementations, the wavelengths correspond to mid-IR wavelengths. In some implementations, donor atom 204 does not display noticeable phonon sidebands and/or two-photon induced photoionization.

Quantum information processor 200 includes an optical resonator 206. A resonator, optical resonator, optical cavity, or cavity is an arrangement of refractive and reflecting material interfaces that allows light waves to form a standing wave. Geometry of resonator 206 allows for resonator 206 to store energy as certain standing waves, photonic modes, or modes. Various modes may have characteristic wavelengths where a characteristic length of the resonator (e.g., one dimensional cavity) is equal to an integer multiple of one quarter of the characteristic wavelength. Modes of a resonator have a frequency. In some implementations, the modes correspond to optical wavelengths (frequencies). Exemplary resonator 206 is shown schematically as two concaved mirrors 206-1 and 206-2. The mirrors are separated by a characteristic length 208. In some implementations, characteristic length 208 is between and including 1 micron and 10 microns. In some implementations, characteristic length 208 is between and including one hundred nanometers and one millimeter.

In some implementations, resonator 206 is defined by features (e.g., voids and protrusions). In some implementations, resonator 206 is defined by voids (e.g., aperture, cavity, depression, groove, hole, indentation, pocket, recess, or slot) on and as part of one or more interfaces of semiconductor material 202. For example, voids may be defined by interface sitting shy of surrounding interface(s). In some implementations, resonator 206 is defined by protrusions (e.g., bumps, pillars, ridges, vanes) upon, or sitting proud of, one or more interfaces of semiconductor material 202. In some implementations, features are spaced apart from each other by about 100 nanometers. In some implementations, the void and protrusions are spaced apart from each other by about 500 nanometers or approximately 800 nanometers. In some implementations, features are spaced apart by between and including 300 nanometers and 3 microns.

Resonator 206 is optically (e.g., evanescently) coupled to donor atom 204. That is, the electric field associated with optical modes in resonator 206 overlaps with the electron wavefunction of donor atom 204. In some implementations, a mode of resonator 206 has a frequency, resonator frequency, matching (i.e., in resonance with) a transition in donor atom 204. That is, the two frequencies are the same, or about the same. Here "about" is used in the sense of plus or minus ten percent of the target frequency. In some implementations, two frequencies that are about the same produce a weaker communication between two systems. In some implementations, resonator 206 has a resonator frequency which is close to one or more of the optical transition frequencies for donor atom 204. An example of optical coupling is evanescent coupling. Evanescently coupling (or near field interaction) includes when two refractive bodies are placed sufficiently close to each other such that electric field waves expected to be internally reflected in the first body propagate into the proximate second body.

Examples of optical resonators include structures defined in silicon-on-insulator material. In some implementations, optical resonators, such as resonator 206, have quality factors of $10^4$. In some implementations, optical resonators have quality factors upwards of $10^3$. In some implementations, optical resonators, such as resonator 206, occupies a space proportional to $(\lambda/n)^3$, where $\lambda$ is the photonic mode wavelength and n the index of refraction of the material included in the resonator.

Donor atoms in semiconductor material can couple to optical resonators, e.g., donor atom 204 and resonator 206. For example, an optical resonator formed from a silicon-on-insulator material may have a cavity mode wavelength near 2.9 microns, a quality factor upwards of $10^4$, and a coupling frequency (i.e., vacuum Rabi frequency) upwards of 1 MHz. The atom-resonator coupling strength can be determined by the cavity mode volume, the atom's placement relative to the resonator, and an orientation of a provided magnetic field, e.g., provided by the quantum input subsystem 156. Resonator 206 couples to a donor atom 204 via resonance (match or near match) of a pair of frequencies: a cavity or mode frequency in resonator 206, and a transition frequency in donor atom 204. Herein the a transition frequency in donor atom 204 or the like may be referred to as a first transition frequency, second transition frequency, and the like for the purposes of enumeration and identification and not to suggest lowest, next lowest, and the like.

Figure 3:
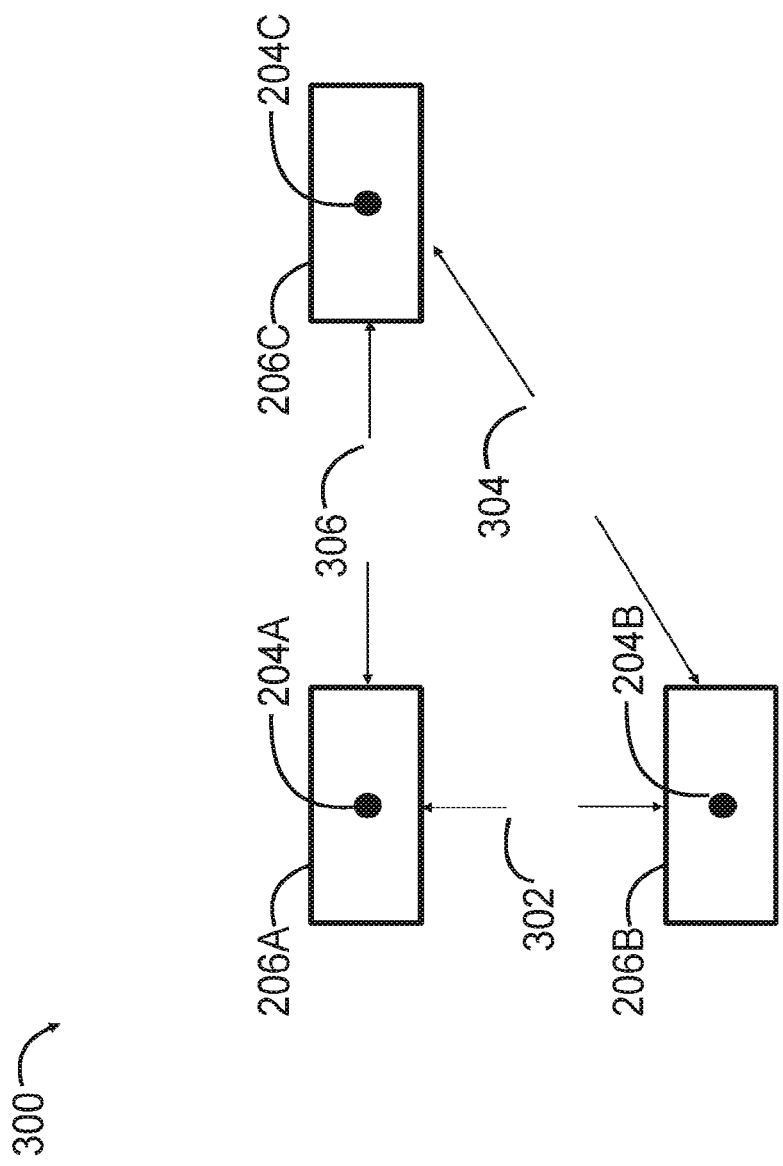
FIG. 3 is a schematic diagram illustrating an exemplary portion of a quantum information processor.

FIG. 3 is a schematic view illustrating an exemplary part of a quantum information processor 300. Quantum information processor 300 includes a plurality of donor atoms 204 and a plurality of resonators 206. One interpretation of the schematic view in FIG. 3 is a plan view of a semiconducting chip including donor atoms 204 and resonators 206.

Quantum information processor 300 includes a plurality of donor atoms including atoms 204A, 204B, and 204C spaced apart. The plurality of donor atoms including atoms 204 are associated with a plurality of resonators including resonators 206A, 206B, and 206C that are spaced apart. In the illustrated example, each donor atom of the plurality of donor atoms 204 and an associated resonator of the resonators 206 align in at least one axis. In various implementations, the required precision on inter donor atom spacing is low.

In some implementations, quantum information processor 300 includes a quantum register comprising two or more donor atoms 204 and one or more resonators 206. In some implementations, quantum information processor 300 includes one or more single electrodes proximate the two or more donor atoms 204 and one or more resonators 206. The electrodes may overly the semiconductor material 202. In some implementations, quantum information processor 300 includes one or more pairs of electrodes proximate to, and astride, the two or more donor atoms 204 and one or more resonators 206. Astride includes dispositions athwart and straddling.

In some implementations, resonators 206A, 206B, and 206C are part of a larger arrangement of resonators. For example, the larger arrangement is a two dimensional tiling. Resonator 206A is spaced apart from resonator 206B by distance 302. Resonator 206B is spaced apart from resonator 206C by distance 304. Resonator 206C is spaced apart from resonator 206A by distance 306. In some implementations, the stagger of resonators is regular and two or more of distances 302, 304, and 306 are the same.

In the illustrated example, distances 302, 304, and 306 are on the order of the distance of a characteristic decay length, $\lambda/n$, where $\lambda$ is a photonic mode wavelength and n the index of refraction of the material separating the resonators 206A, 206B, and 206C. For example, $\lambda$ may be the mean wavelength associated with dominant photonic modes in resonators 206A, 206B, and 206C. In some implementations, the distance between resonators is ten times the characteristic decay length. In some implementations, the characteristic wavelength is the wavelength in the medium or media separating resonators 206A, 206B, and 206C. For example, in silicon the wavelength is reduced by a factor of about three, that is, $n(\lambda) \approx 3.45$ for some wavelengths $\lambda$.

In some implementations, quantum information processor 300 includes a plurality of couplers wherein each coupler includes two resonators. For example, resonators 206A and 206B are a coupler for donor atoms 204A and 204B.

In some implementations, the resonator 206A, 206B, and 206C are coupled by waveguides. In some implementations, distances 302, 304, and 306 can be as small as a micron and as long as meters. In some implementations, resonators 206A, 206B, and 206C are on different semiconductor substrates and are coupled by waveguides or fiber optics. In some implementations, a first plurality of donor atoms and resonators included with a first semiconductor substrate is optically coupled to a second plurality of donor atoms and resonators included with a second semiconductor substrate.

In some implementations, the remote substrates are coupled by one or more waveguides is included in a Type II quantum computer—smaller quantum systems coupled by lossy or classical channels.

Figure 4:
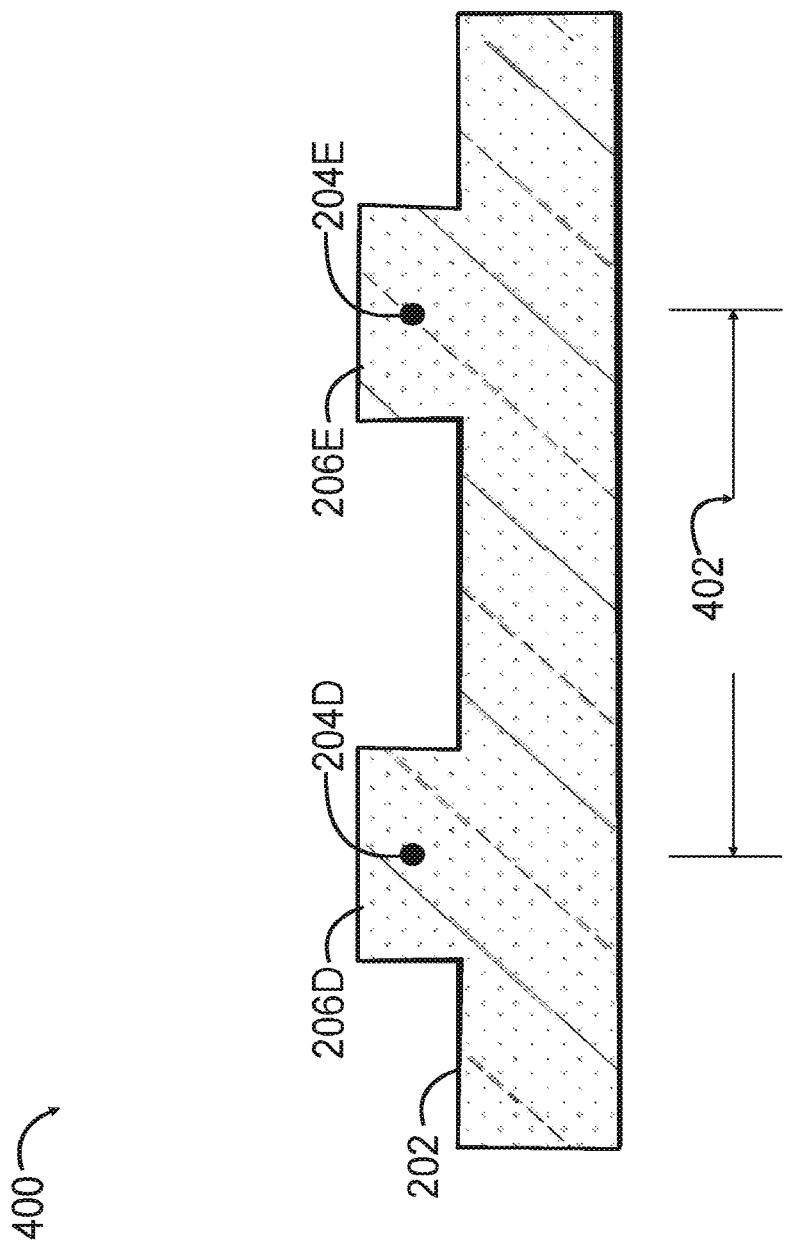
FIG. 4 is a schematic diagram illustrating an exemplary portion of a quantum information processor including a pair of donor atoms.

FIG. 4 is a schematic view illustrating an exemplary part of a quantum information processor 400 including a pair of donor atoms 204D and 204E. Each donor atom of the pair of donor atoms is associated with a resonator, e.g., resonators 206D and 206E. The resonators 206D and 206E may be defined within semiconducting structures sitting shy of a substrate. In some implementations, resonators 206D and 206E sit proud the substrate and are principally separated by free space, e.g., vacuum or air. In some implementations, the resonators are principally separated by a cladding material such as silicon nitride. A distance 402 between resonators 206D and 206E is on the order of the distance of a characteristic wavelength for the pair of resonators. In some embodiments, the characteristic wavelength is the wavelength in the medium or media separating the pair of resonators. Free space between the pair of resonators, versus intervening solid material, allows for greater distance between resonators or equal distance with larger coupling strength.

Figure 5:
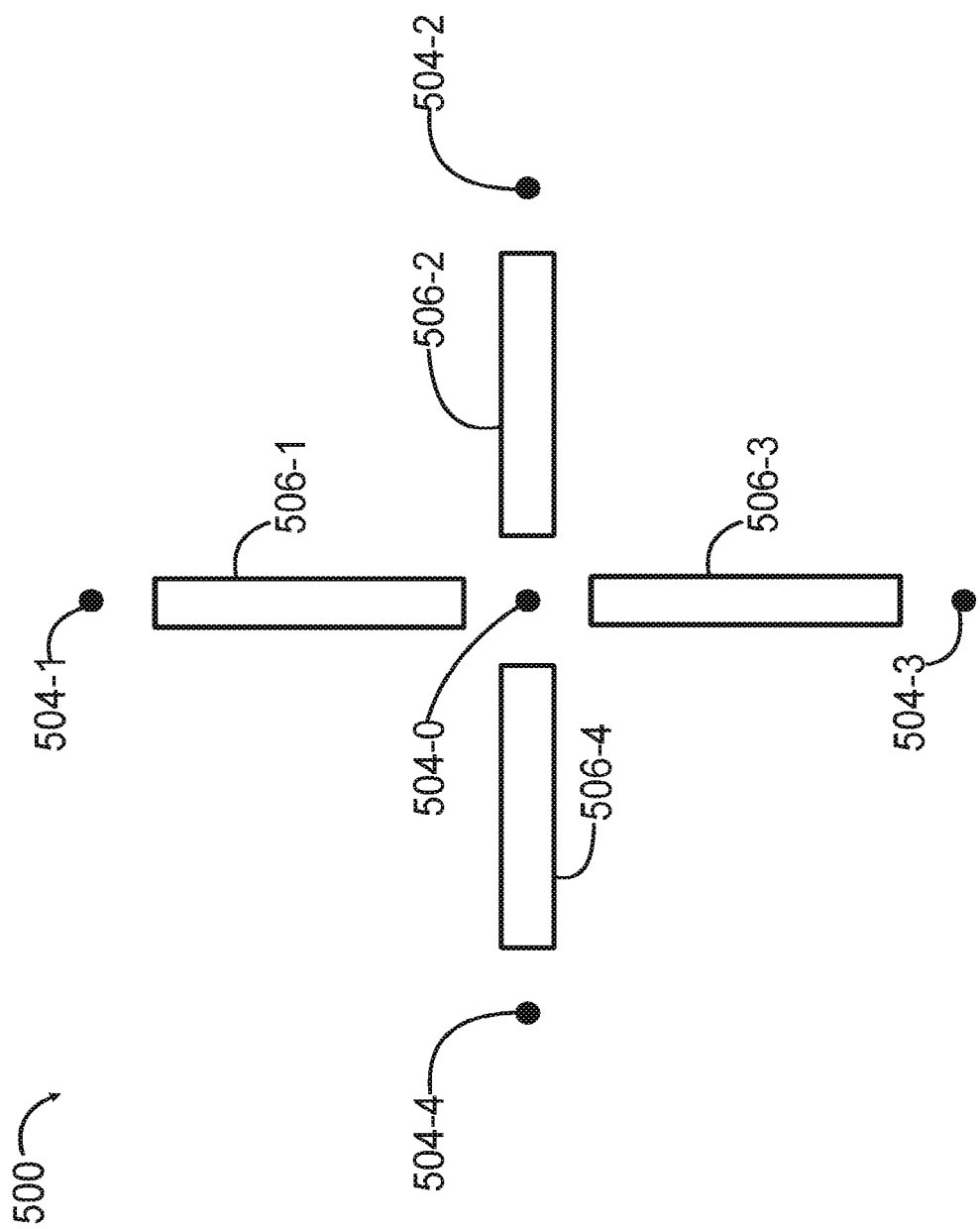
FIG. 5 is a schematic diagram illustrating an exemplary portion of a quantum information processor.

FIG. 5 is a schematic view illustrating an exemplary part of a quantum information processor 500. Quantum information processor 500 includes a plurality of donor atoms 504-0, 504-1, 504-2, 504-3, and 504-4, collectively 504. Quantum information processor 500 includes a plurality of resonators 506-1, 506-2, 506-3, and 506-4, collectively 506. A resonator may be interposed between a first donor atom and a second donor atom. For example, resonator 506-1 is interposed between donor atom 504-0 and donor atom 504-1. As illustrated in FIG. 5 both the apparent centroid and principal axis (e.g., longitudinal axis) of resonator 506-1 is inline with donor atom 504-0 and donor atom 504-1. However, if a resonator is coupled to a first donor atom and a second donor atom then to be "interposed between" neither the centroid and principal axis of the resonator need be in line with the first donor atom and the second donor.

Each donor atom is associated with, and communicatively coupled to, a plurality of resonators. In this way, donor atoms can be communicatively coupled via shared resonator(s). Resonators 506 can be constructed in the same manner that resonators 206 can be constructed.

The exemplary part of quantum information processor 500 can be extended. In some implementations, resonators 506 and donor atoms 504 are part of a larger arrangement of resonators and donor atoms. For example, the larger arrangement is a two dimensional tiling i.e. plurality of donor atoms 504-0, 504-2, and 504-3 and resonators 506 form a repeatable sub-portion of an exemplary quantum information processor. Repeatable sub-portions may be tiled over a larger area.

In various implementations, required precision on interdonor atom spacing is low. Donor atoms 504 may have an intended stagger but also have a straggle (i.e., distance out of intended position) of up to 50 nm or up to and including 100 nm. This tolerance compares favorably to precision of implantation techniques.

In some implementations, quantum information processor 500 includes a plurality of couplers wherein each coupler includes a resonator. For example, resonator 506-1 is a coupler for donor atoms 204A and 204B. The operation of couplers is described herein at least in relation to FIG. 12.

Figure 6:
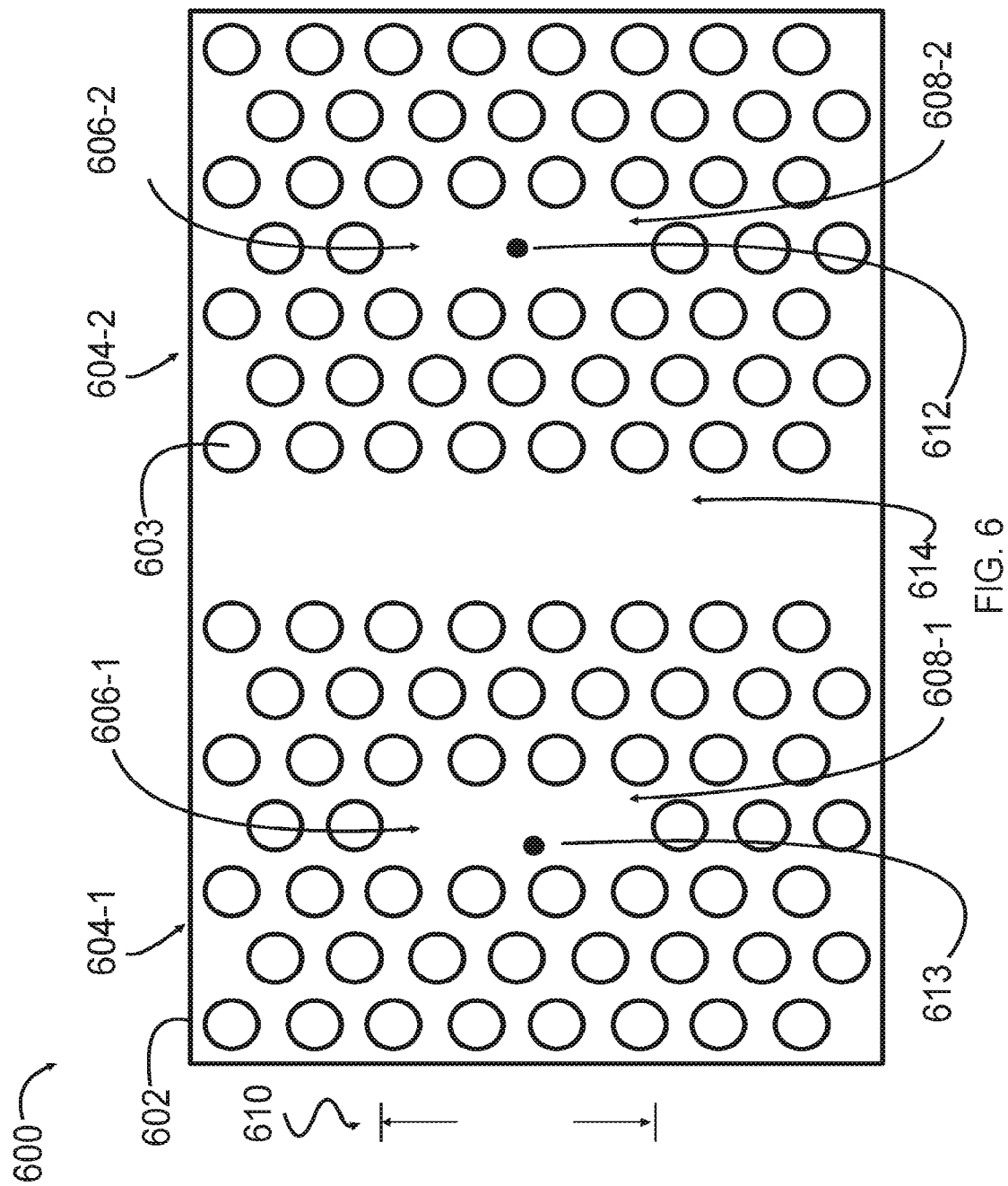
FIG. 6 is a schematic diagram illustrating an exemplary portion of a quantum information processor that includes a pair of optical resonators and a pair of donor atoms.

FIG. 6 is a schematic diagram illustrating an exemplary part of a quantum information processor 600 that includes a pair of optical resonators and a pair of donor atoms. The exemplary part of quantum information processor 600 includes a photonic crystal defined in a semiconductor substrate 602.

A photonic crystal is a periodic optical structure that affects the motion of photons within and through the structure. That is, it strongly confines light. A photonic crystal is characterized by a band gap, or stop band. A band gap is a range of photon frequencies at which, if tunneling effects are neglected, no photons can be transmitted through a material, e.g., semiconductor substrate 602. Fabrication methods for a photonic crystal depend on the number of dimensions that the photonic bandgap must exist in.

In some implementations, fabrication of one or more quantum information processors includes use of semiconductor fabrication facilities, machines, and procedures for CMOS wafers. In some implementations, fabrication of quantum information processor(s) includes thin film deposition, patterning, and etching. Unless the specific context requires otherwise, throughout this specification the terms like "deposit", and "deposition" are used to encompass any method of material deposition, including but not limited to physical vapor deposition (PVD), chemical vapor deposition (CVD), plasma-enhanced PVD, plasma-enhanced CVD, and atomic layer deposition (ALD). Unless the specific context requires otherwise, throughout this specification the terms like "pattern", and "patterned" are used to encompass any method of forming materials on, in, and overlying a substrate, or the substrate, to particular shapes or patterns by applying and treating mask material (e.g., resists), and defining in geometric shapes in the mask material via exposure to radiation, e.g., light or electrons. Etching removes layers of material, e.g., substrates, semiconductor layers, dielectric layers, oxide layers, electrically insulating layers, and/or metal layers according to desired patterns set out by photoresists or other masks. Exemplary etching techniques are wet chemical etching, dry chemical etching, plasma etching, physical etching, and reactive ion etching.

Quantum information processor 600 includes semiconductor substrate 602. Semiconductor substrate 602 includes or supports one or more resonators. Defined within or upon semiconductor substrate 602 is a generally periodic optical structure including two or more features, e.g., voids and protrusions. As illustrated in FIG. 6, a lattice of features, lattice 604, is defined in or on semiconductor substrate 602.

In some implementations, lattice of features 604 are holes (e.g., cylinders, depressions, holes, indentations, or voids) defined the semiconductor substrate 602. Lattice 604 may be regular, e.g., an equilateral triangular lattice. In the case of an equilateral triangular lattice, two parameters define a regular triangular lattice. A lattice constant defines the distance between holes—center to center. A radius defines the size of the holes (e.g., hole 603) in lattice 604. The latter can be expressed as a fraction of the former. In some implementations, the resonator's interior (or cavity) is defined by one or more interruptions in the lattice. In some implementations, the interruptions are features missing from, or displaced within, the lattice. For example, an absence of a feature causes an interruption in a pattern of features. Another example is feature present but laterally shifted from a regular position. As shown in 600 a plurality of holes is missing from lattice 604. These include lattice interruptions 606-1 and 606-2. Lattice interruption 606-1 defines a one-dimensional resonator's interior (or cavity). Each lattice interruption is characterized or described by a principal axis, and a spatial extent or length L (line segment 610) along or parallel to the principal axis.

Part of quantum information processor 600 includes an optical resonator 608-1 and an optical resonator 608-2. Optical resonator 608-1 (608-2) includes parts of semiconductor substrate 602 and lattice 604, and lattice interruption 606-1 (606-2). The electric field inside a resonator (e.g., optical resonator 608-1) can be designed to leak out.

Quantum information processor 600 includes a plurality of donor atoms. Exemplary donor atom 612 is placed in optical resonator 608-2. In some implementations, a donor atom is placed at an antinode of a photonic mode of an optical resonator. An antinode includes a region of maximum amplitude between nodes. For example, donor atom 612 is placed about the mid-point of optical resonator 608-2. In some implementations, a donor atom is placed away from the center of the resonator. For example, donor atom 613 is placed towards a corner of optical resonator 608-1. Donor atom 613 may couple to a different mode of the resonator or have a lesser coupling strength.

Quantum information processor 600 includes an optical structure 614 in communication with optical resonator 608-1 and optical resonator 608-2. Optical structure 614 may be a waveguide supporting one or more propagating modes, or a resonator supporting one or more resonant modes.

Figure 7:
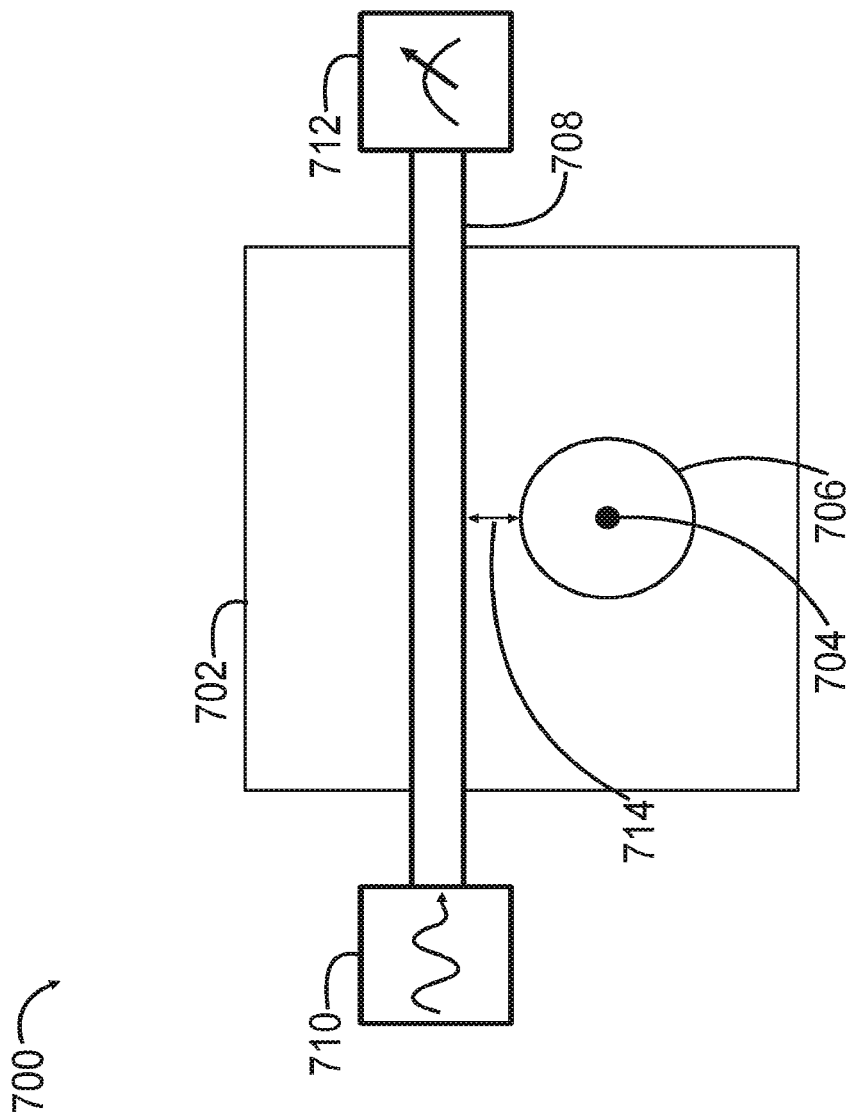
FIG. 7 is a schematic diagram illustrating an exemplary portion of a quantum information processor that includes an optical readout device.

FIG. 7 is a schematic diagram illustrating an exemplary portion of a quantum information processor 700 that includes an optical resonator 706 and a waveguide 708, e.g., an optical fiber. A donor atom 704 is coupled to optical resonator 706. The state of donor atom 704 is read out via interaction of optical resonator 706 and waveguide 708.

Quantum information processor 700 includes a semiconductor substrate 702, with a donor atom 704 implanted therein. Donor atom 704 is coupled to an optical resonator 706 defined on or in semiconductor substrate 702. Optical resonator 706 is communicatively coupled to waveguide 708 separated by distance 714. In some implementations, waveguide 708 is an on-chip photonic waveguide. In some implementations, optical fiber is used.

A light source 710 sends light down waveguide 708 to interact with optical resonator 706, and be measured at detector 712. Optical resonator 706 is coupled to donor atom 704. The state of donor atom 704 affects the state (e.g. frequency) of optical resonator 706. In some implementations, the transmission of light from light source 710, through waveguide 708, and into detector 712, will vary depending upon the frequency of optical resonator 706. For example, for a particular waveguide-resonator spacing 714, if the light source frequency matches the frequency for optical resonator 706, the transmission to detector 712 will be less than if the light source frequency differs from the resonator frequency. Similarly, the reflection of light back to the light source will decrease when the light source frequency matches the optical resonator frequency. The wavelength-dependent transmission of the optical channel between light source 710 and detector 712 reveals any coupling to a number of nearby donor spins. If the optical resonator 706 is coupled to a spin-selective subset of optical transitions, this wavelength-dependent transmission reveals the spin state of the coupled donor spin(s). In some implementations, the optical detector includes a combination of electrical and optical elements to detect changes in properties of the light in waveguide 708, such as, optical polarization, number of photons, optical intensity, relative indistinguishability of multiple photons, optical frequency, time of detection, spatial distribution of the light, or similar, which can be used to infer a state for optical resonator 706 and coupled deep impurity, e.g., donor atom 704.

Figure 8:
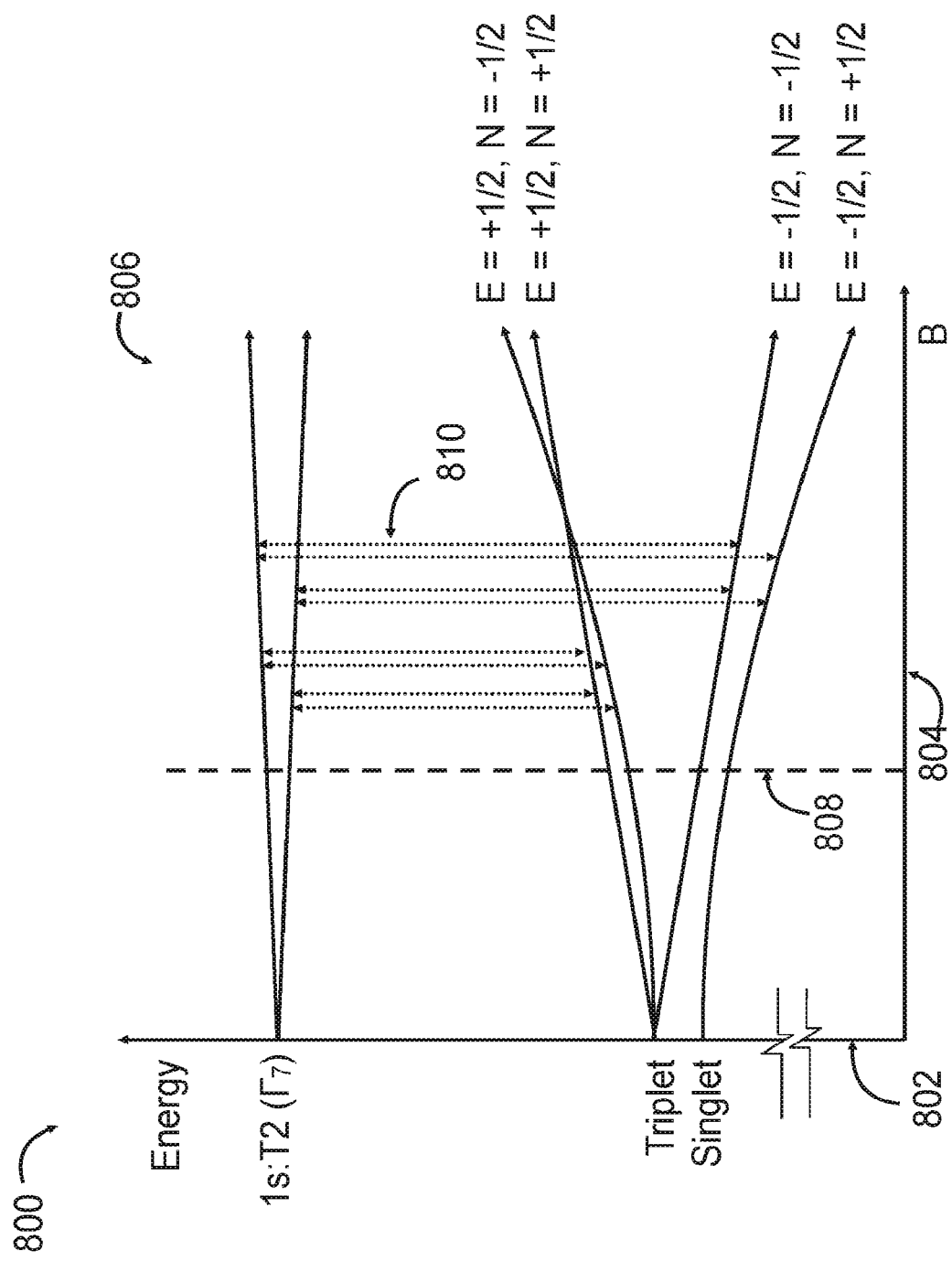
FIG. 8 is a graph illustrating energy levels plotted against magnetic field for an impurity electron-nuclear system.

FIG. 8 is a graph 800 illustrating energy plotted against background magnetic field strength. Graph 800 includes the energy of eigenstates (i.e. allowed steady-states) plotted against magnetic field for a coupled nuclear spin-1/2, electron spin-1/2 impurity system. In graph 800 nuclear-spin splittings are artificially amplified to illustrate particular features. Graph 800 includes energy on a first axis 802 and transverse magnetic field on axis 804. A series of energy levels 806 for a nuclear spin (N) and electron spin (E) are plotted. Include are the 1s:A ground states (labelled with singlet and triplet) and the 1s:Γ7 existed states with transitions 810 between. These electron-nuclear spin state labels, are good quantum numbers, in the high-field limit, e.g., above 1 Tesla. In some implementations, nuclear isotopes with a spin-0 or spin-3/2 (e.g. sulfur-34 and sulfur-33, respectively) are used in place of nuclear spin-1/2 isotopes such as selenium-77, which alters the level structure accordingly.

For a given electron-nuclear spin-1/2 system with a given electron-nuclear coupling there exists a particular magnetic field 808, called a "clock transition", where the derivative of the nuclear spin states' transition frequencies are zero. In some implementations, this magnetic field is used to further extend the nuclear spin coherence times by reducing their transition frequencies' sensitivity to magnetic field fluctuations. With increasing magnetic field, the energy of different states diverge. In some implementations, higher nuclear spin systems additionally possess electron spin clock transitions, where the derivative of the electron spin states' transition frequencies are zero.

The computational states for quantum computing and quantum information processing vary with implementation. In some implementations, the computational states are based on the nuclear spin of a deep impurity, e.g., donor atom. An example, encoding is $|0\rangle = |\downarrow\rangle_n$ and $|1\rangle = |\uparrow\rangle_n$. In some implementations, the computational states are based on the electron spin of an impurity. An example, encoding is $|0\rangle = |\downarrow\rangle_e$ and $|1\rangle = |\uparrow\rangle_e$. In some implementations, the computational states are based on the electron spin and nuclear spin for an impurity. These are singlet/triplet qubits where the singlet state is spin-0 and the triplet state is a triply degenerate spin-1 state. For example, $|0\rangle \propto |\uparrow\downarrow\rangle - |\downarrow\uparrow\rangle$ and $|1\rangle \propto |\uparrow\downarrow\rangle + |\downarrow\uparrow\rangle$, $|1\rangle = |\downarrow\downarrow\rangle$, and $|1\rangle = |\uparrow\uparrow\rangle$. The first spin could be the electron spin and the second the nuclear spin.

In some implementations, the $|0\rangle$ and the $|1\rangle$ qubit states are defined by the ground states, for example the levels labelled 1s:A, and optically excited states, for example the levels labelled 1s:T2.

A Hamiltonian describing the spin interactions for the electron spin and the nuclear spin of an isolated deep impurity, such as, donor atom 204 in the presence of a magnetic field (e.g., $\vec{B} = -B\hat{z}$) is:

$$H = g_e \mu_B B \sigma_e^z - g_n \mu_n B \sigma_n^z + A \vec{\sigma}\cdot\vec{\sigma}_n$$

The first two terms are the Zeeman terms for the electron and nuclear spins while the third term is the hyperfine interaction. Here, $\mu_B$ is the Bohr magneton, $\mu_n$ is the nuclear magneton, and $g_e$ and $g_n$ are the electronic and nuclear g factors. The $\sigma_e^z$ and $\sigma_n^z$ are the z-parts of the full spin operators (e.g., $\vec{\sigma}_e$), B is the magnetic field defined above; and A is a material dependent constant, i.e., hyperfine constant. When the magnetic field is strong the following are good labels for the system $|e\ n\rangle = \{|\downarrow\downarrow\rangle, |\downarrow\uparrow\rangle, |\uparrow\downarrow\rangle, |\uparrow\uparrow\rangle\}$.

Absent excitation, e.g., at low temperatures, the electron spins have a low energy state. The nuclear spin states differ by an energy $$E_0 = \left(\frac{h}{2\pi}\right)\omega_0,$$

corresponding to the nuclear resonance frequency. By applying magnetic pulses in the transverse direction $\vec{B}_T = B_T \sin(\omega_0 t)\hat{x}$ the spins oscillate at the nuclear resonance frequency. In this example of a sigma-X operation the spins can be flipped, be put into a superposition of spins, and the like. This is magnetic resonance control, e.g., NMR and ESR, for a plurality of deep impurities. Optical excitation near resonance with the optical transition frequency to an impurity's excited state can also be used to control the ground spin qubit state. One spin associated with a first deep impurity can be selected from a plurality of spins by applying a voltage to an electrode capacitively coupled to the first deep impurity. That is varying a voltage of a capacitor that includes the first deep impurity. The magnetic resonance frequencies, as well as the optical transition frequencies for the deep impurity change. For a positive charge on the electrode the magnetic resonance frequency declines, $\omega'_0 < \omega_0$. Now one impurity, a target impurity, is addressable from amongst a plurality of impurities using optical or magnetic resonance control. A quantum input subsystem may create similar frequency shifts by straining the semiconductor substrate near the target donor atom.

Figure 9:
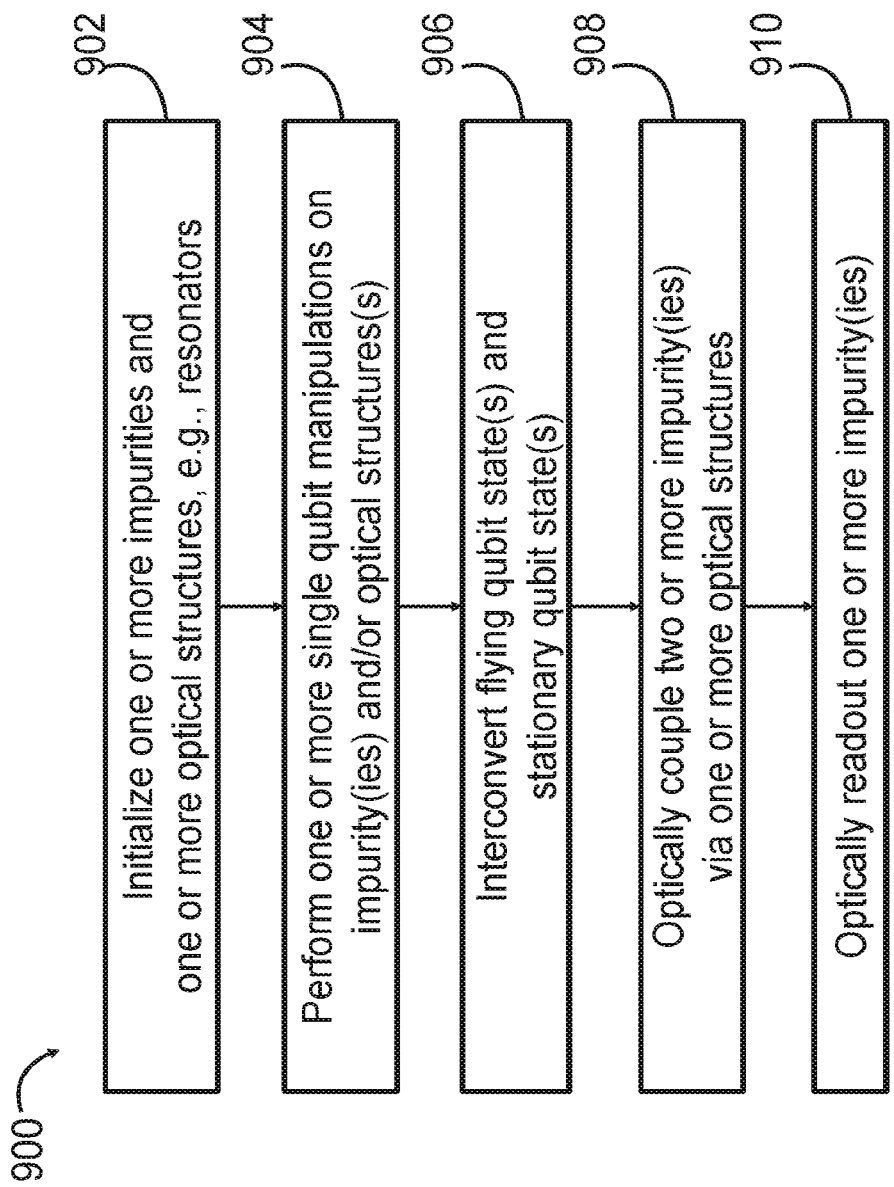
FIG. 9 is a flow-diagram illustrating an implementation for a method of operation in a quantum information processor.

FIG. 9 illustrates an example method 900 of operation for a quantum information processor. For the method 900, as with others methods taught herein, the various acts may be performed in a different order than that illustrated and described. Additionally, the methods can omit some acts, and/or employ additional acts. One or more acts of method 900 may be performed by or via one or more circuits, for instance one or more hardware processors. In some implementations, method 900 is performed by a controller, e.g., control subsystem 104 of system 100.

Method 900 normally begins by invocation from a controller. At 902, the controller causes one or more qubits to be prepared. In some examples, the controller causes one or more impurities (e.g., donor atoms) and one or more optical structures, (e.g., optical resonators or waveguides) to be initialized.

At 904, the controller optionally causes single qubit manipulation of one or more qubits to be performed. In some implementations, the controller causes the quantum input subsystem to apply magnetic resonance pulses, and/or mechanical pulses, and/or electrical pulses, and/or optical pulses to one or more deep impurities and/or one or more optical structures. In some implementations, single qubit manipulation includes applying a sigma-X operation.

In some implementations, spin qubits can be manipulated using magnetic resonance. In some implementations, spin qubits can be manipulated using optical pulses. These magnetic or optical control fields can be applied to single deep impurity, single optical structures, a plurality of deep impurities, and/or plurality of optical structures. In some implementations, individual deep impurities' and optical structures' characteristics, for example, frequencies and coupling strengths, can be controlled externally, using, for example, magnetic field gradients, strain, or electric fields. This allows global control fields to act selectively on subsets of deep impurities and optical structures.

In some implementations, the controller performs one of acts 906, 908, and 910. At 906, the controller causes an analog computer to interconvert a photon, or flying qubit, into a spin qubit state and/or vice versa. In some implementations, the controller causes a quantum input subsystem and/or a quantum output subsystem to interconvert a photon qubit into a spin qubit state or a qubit into a photon qubit state. At 908, the controller causes two or more deep impurities to be coupled via one or more optical structures. At 910, the controller causes one or more deep impurities and/or one or more optical structures to be read out. Method 900 ends until invoked again.

Figure 10:
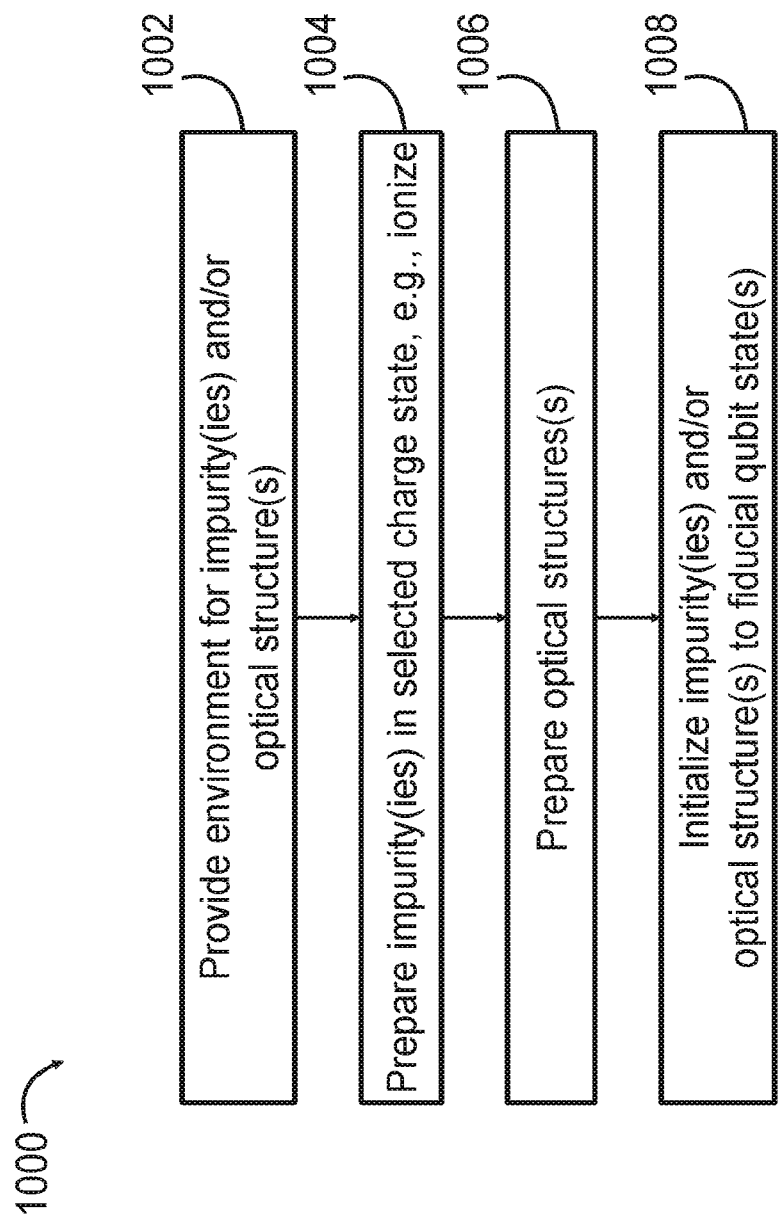
FIG. 10 is a flow-diagram illustrating an implementation for a method to prepare one or more qubits in an initial state.

FIG. 10 illustrates an example method 1000 of operation for a quantum information processor. Method 1000 is an implementation of act 902. For the method 1000, as with others methods taught herein, the various acts may be performed in a different order than that illustrated and described. Additionally, methods can omit some acts, and/or employ additional acts. One or more acts of method 1000 may be performed by or via one or more circuits, for instance one or more hardware processors. In some implementations, method 1000 is performed by a controller, e.g., control subsystem 104 of system 100.

Method 1000 normally begins by invocation from a controller. At 1002, the controller causes an analog computer and/or environmental subsystem to prepare an isolated environment for a quantum information processor to provide an environment for one or more impurities and/or optical structures. For example, the quantum information processor may include one or more deep impurities (e.g., donor atoms), and one or more optical structures (e.g., resonators).

At 1004, the controller causes an analog computer 102 and/or quantum input subsystem 156 to prepare one or more impurities (e.g., donor atoms), in a selected charge state, such as, singly-ionized state. For example, a donor atom (such as, donor atom 204, i.e., a stable, non-gaseous, chalcogen atom) is an atom disposed in semiconductor material 202. In operation of a quantum information processor in accordance with method 1000 such donor atoms may be singly-ionized. Two electrons are bound to chalcogen donor atoms in their electrically neutral state, making them helium-like or a double donor. The binding energy of a first electron for a chalcogen donor atom is much less than for a second electron, e.g., by a factor of two. Using a variety of methods, one electron is stripped from a donor atom making it hydrogen-like. That is, the double donor may be singly-ionized. One method to prepare a hydrogen-like donor atom includes photoionization: the application of light with energy greater than the neutral donor atoms' binding energy. A second method involves electrically biasing the device with nearby electrodes. In some implementations, the quantum information processor includes acceptor sites within the semiconductor material to receive free electrons. One suitable material for an acceptor site is boron. An acceptor could include an acceptor from Group III (13), e.g., boron, aluminum, gallium, and indium.

At 1006, the controller causes one or more optical structures (e.g., optical resonators or waveguides) to be initialized. For example, at low temperature and after a long time one or more optical resonators will have no photons remaining. That is, in particular environments (e.g., low temperatures) the optical resonators will be thermally unpopulated (i.e., zero photons), and so are initialized through equilibration with the environment.

At 1008, the controller causes analog computer 150 and/or quantum input subsystem 156 to prepare one or more impurities and/or optical structures to be in a fiducial state.

The fiducial state depends on the computational states being used by the quantum information processor. In some embodiments, the one or more qubits are in state |0⟩. To initialize impurities' spin states a number of techniques exist. In some implementations, the application of particular optical frequencies can be used to drive the spins of impurities into a pre-determined initial state. In some implementations, it is possible to measure the spins and if necessary manipulate each qubit to the desired state using magnetic resonance (e.g., EPR, NMR) or pulsed optical techniques. That is, in the beginning of a calculation, each qubit in a quantum information processor is initialized so that they have known and well-defined computational (logic) states, e.g., nuclear spin states, electron spin states, or a combination. This can be achieved by reading out each qubit. When the measured state for a qubit is wrong the controller manipulates the state of the qubit to align with the correct initial state. In some implementations, the qubits are nuclear spins. In some implementations, the qubits are electron spins. In some implementations, for example using near-zero magnetic fields, the electron-nuclear spin qubits are described as singlet/triplet qubits. Singlet/triplet states can also be initialized using the same techniques as described for the individual electron-nuclear spin cases. In some implementations, combinations of the above qubits are employed simultaneously.

Figure 11:
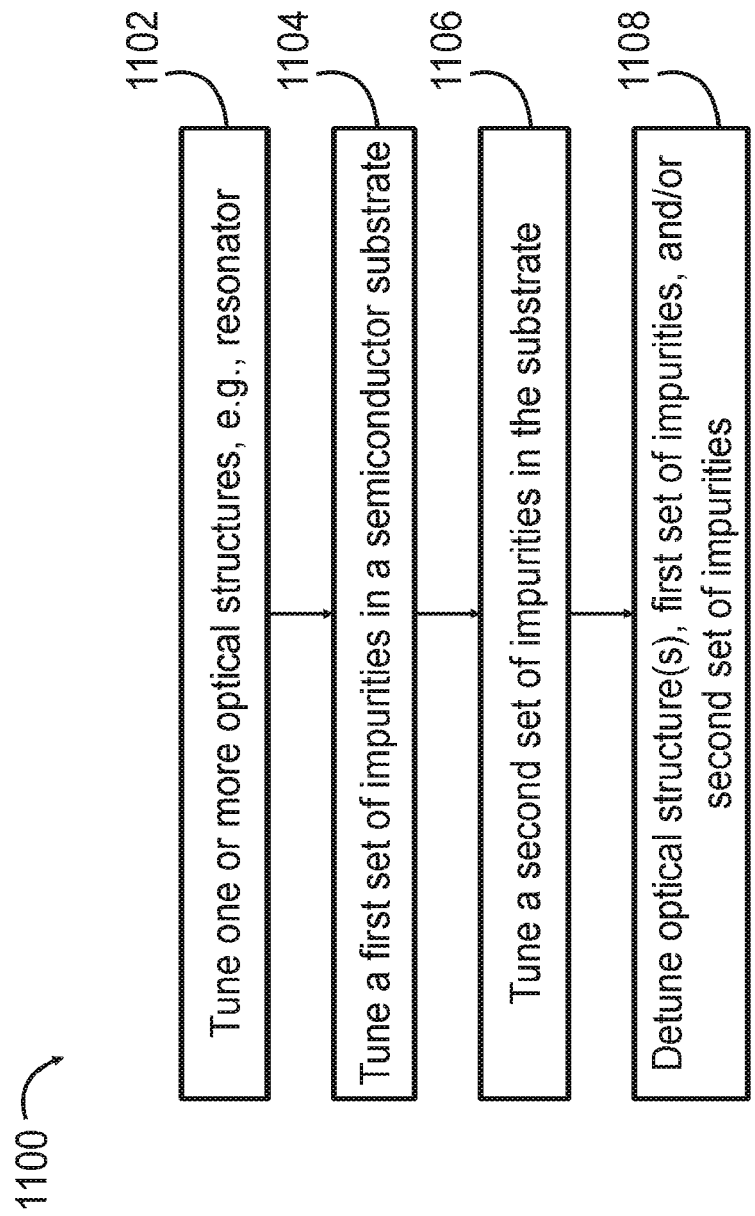
FIG. 11 is a flow-diagram illustrating an implementation for a method to couple two or more qubits.

FIG. 11 illustrates a method 1100 of an example operation for a quantum information processor. Method 1100 is an implementation of act 908 of FIG. 9. For method 1100, as with others methods taught herein, the various acts may be performed in a different order than that illustrated and described. Additionally, the methods can omit some acts, and/or employ additional acts. One or more acts of method 1100 may be performed by or via one or more circuits, for instance one or more hardware processors. In some implementations, method 1100 is performed by a controller, e.g., control subsystem 104 of system 100.

Donor atoms in semiconductor material can be communicatively coupled to one another through a number of methods compatible with the systems and devices described herein. In some implementations, donor atoms will couple via single optical structure, and/or multiple optical structures, and/or flying photons. FIG. 5 shows examples of an optical structures coupling two deep impurities. FIG. 3 shows examples of two optical structures coupling two deep impurities. Methods to interconvert photons and qubits are shown herein.

Method 1100 shows three acts 1102, 1104, and 1106 but in some implementations only one act is performed. In some implementations, a plurality of coupled qubits comprises a plurality of donor atoms with a plurality of transition frequencies. The plurality of qubits are coupled when each qubit is in near-resonance with each other qubit, and one or more optical structures; and when each qubit and each optical structure are proximate, e.g., are within distances comparable to characteristic distance.

Method 1100 normally begins by invocation from a controller. At 1102, the controller causes analog computer, and/or quantum input subsystem to tune an optical structure (e.g. an optical resonator).

Different tuning methods are suitable to (de)tune an optical structure for control, or calibration purposes, e.g., couple a donor atom to the optical structure, or overcome variation in resonance frequency between multiple optical structures. In some implementations, a control subsystem injects electrical carriers via electrodes proximate to the optical structure. For example, electrodes in electrical contact with a substrate, such as, semiconductor material 202, and disposed either side of an optical structure.

In some implementations, the quantum information processor includes a device to strain a bulk of semiconductor material. In some implementations, the strain is applied to semiconductor material including an optical structure. A control subsystem can cause the compression, or stretch (generally, strain) of a region of semiconductor material including one or more optical structures and/or one or more donor atoms. When strain changes characteristic dimensions (e.g., resonant geometry), and/or properties, of the optical structure there is a change in frequency (e.g., resonator frequency) of the optical structure. Strain can also be used to change the optical transition frequencies of a donor atom. Strain, e.g., strain in one direction, in a semiconductor substrate is a mechanical force that has small effect on the 1s:A ground states but changes the energy levels of the 1s:Γ7 excited states and thus the energy difference between these states. See transitions 810 in FIG. 8.

In some implementations, the device to strain the semiconductor material includes piezoelectric material, such as, lead zirconate titanate, barium titanate, or strontium titanate, electrically coupled to power source via two electrodes. A controller varies a current passing between the two electrodes and through the piezoelectric material, and the semiconductor material is strained. In some implementations, the device includes micro-electro-mechanical systems (MEMS) to strain the bulk of semiconductor included in the optical structure.

In some implementations, the quantum information processor includes static strain in a bulk of semiconductor. The residual film stress gradient in the structural layer induces a strain gradient. The static strain can be counteracted or reinforced by a piezoelectric and/or MEMS.

At 1104, the controller causes analog computer, and/or quantum input subsystem to tune a first set of impurities (e.g., donor atom(s)) in a semiconducting material. In some implementations, the first set includes one donor atom. In some implementations, the first set includes a plurality of donor atoms. In some implementations, the controller causes, via an input subsystem, strain in the semiconductor material to change the optical transition frequency of a donor atom. In some implementations, the controller causes an input subsystem to apply a magnetic field to change the optical transition frequencies of a plurality of donor atoms. In some implementations, the controller causes an input subsystem to manipulate the spin states of a plurality of donor atoms to change their optical transition frequencies.

At 1106, the controller causes analog computer, and/or quantum input subsystem to tune a second set of impurities (e.g., donor atom(s)) in the semiconducting material. The set may be one or more donor atoms. The controller can effect the tuning via strain and/or magnetic field. By using a magnetic field with a spatial gradient, the controller may select and tune certain donor atoms.

At 1108, after a suitable period the controller causes analog computer, and/or quantum input subsystem to detune one or more of the first set of impurities, second set of impurities, and the one or more optical structures out of resonance. The period determines the coupling. In the example, of the first and the second set of donor atoms including one donor atom then an interaction between the plurality of qubits is the product of a time varying coefficient and the multi-qubit diagonal terms. For example, in the case of two qubits the coupling term may have the form:

$$H_c \propto J(t)\sigma_1^z \otimes \sigma_2^z$$

where $H_C$ is the Hamiltonian operator of the interaction, $J(t)$ is the time-varying coefficient and $\otimes$ represents an tensor product between the z-component of the spin operator (i.e., the sigma-Z operator) of the first donor atom and the z-component of the spin operator of the second donor atom.

Figure 12:
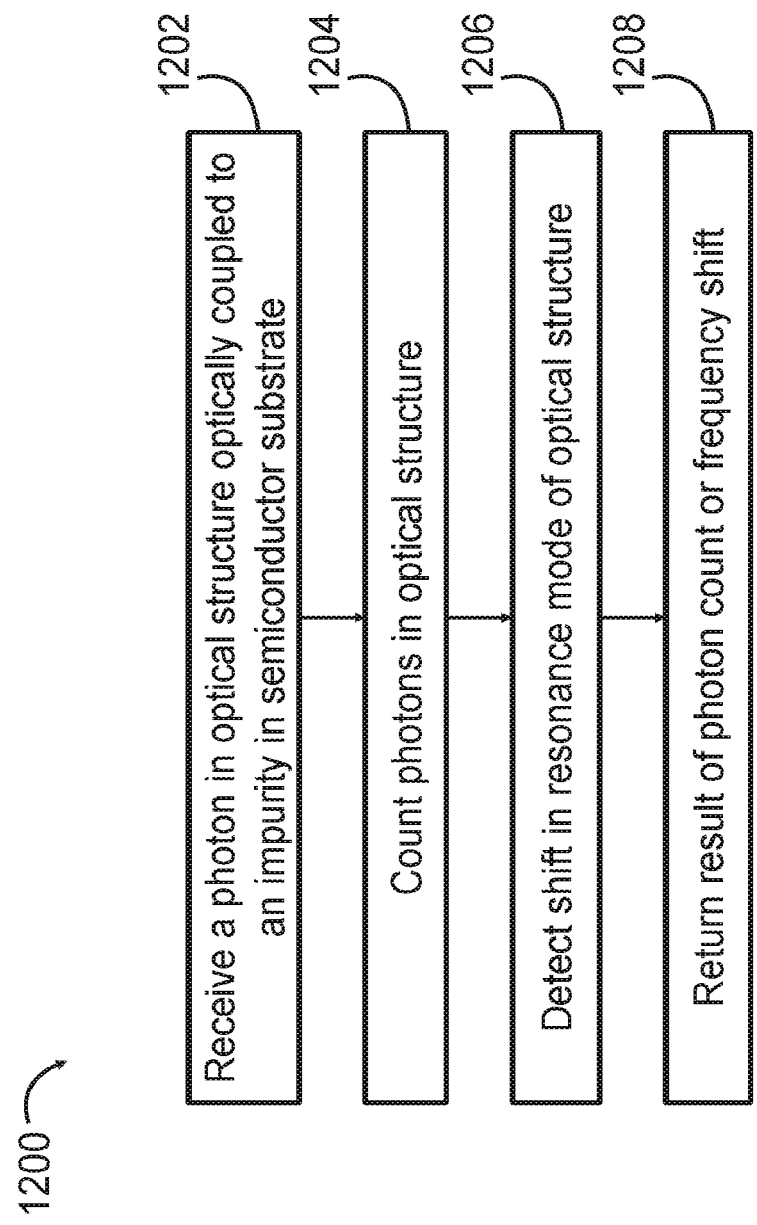
FIG. 12 is a flow-diagram illustrating an implementation for a method to read out of at least one qubit.

FIG. 12 is a flow-diagram illustrating an example implementation of a method 1200 to read out states of donor atoms. Method 1200 is an implementation act 910 of FIG. 9. For method 1200, as with others methods taught herein, the various acts may be performed in a different order than that illustrated and described. Additionally, the methods can omit some acts, and/or employ additional acts. One or more acts of method 1200 may be performed by or via one or more circuits, for instance one or more hardware processors. In some implementations, method 1200 is performed by a controller, e.g., control subsystem 104 of system 100.

At 1202 a controller receives information representing a non-zero likelihood that an optical structure (e.g., an optical resonator) optically coupled to an impurity (e.g., a donor atom) may have received a photon. For example, the optical resonator is coupled to a donor atom included in a computation. After 1202 the controller may perform act 1204 or act 1206.

At 1204 the controller, via a quantum output subsystem, counts the number of photons in the optical structure, e.g., optical resonator. The state of the donor atom coupled to the optical structure may be inferred.

At 1206 the controller, via a quantum output subsystem, infers the donor atoms' spin states by measuring the optical frequency, or other optical characteristics of a communicatively coupled optical structure (e.g., optical resonator). In some implementations, the parity of multiple donor atoms' spin states can be inferred by measuring the optical frequency or other optical characteristics of a communicatively coupled optical structure.

The state of the donor atom affects the state (e.g., frequency) of the optical structure. By causing the transmission of light onto an optical structure and observing the reflection and or absorbing of the light the state of any donor atom or atoms coupled to the optical structure can be inferred. The light may be black body light with non-trivial spectral density at a resonance of an optical resonator. The light may be narrow spectral light matching one or more resonances of a donor atom and/or resonator. If the light source frequency matches the resonator frequency, then the light will be absorbed and otherwise reflected. If the states of a coupled donor atom affect the resonance of a resonator the state of the donor atom may be inferred from absorption and reflection data. In various implementations, a single photon could be used to infer the spin qubit state. In various implementations, a plurality of photons could be used to infer the spin qubit state.

At 1208, the controller returns the result of photon count or frequency shift. In some implementations, the controller stores the result of photon count or frequency shift.

In some implementations, readout devices and couplers are used to implement a quantum error correcting code on a quantum information processor. Quantum error correcting codes can be used to improve the performance of a quantum computer. Recently, surface codes have emerged as useful methods. These have high tolerance to errors in the physical qubits. The surface code has a fault-tolerant threshold of about 1%. That is, if the probability of an error with every time step in a gate mode quantum computation is less than 1%, then it is believed arbitrarily long computations are possible. That is, the code will correct for any errors. Normally in surface code implementations each physical qubit is coupled to its nearest neighbor forming a two dimensional grid with half the qubits, logical qubits, being used to store the quantum information and the other half of the qubits, being used as ancillary qubit for error correction. However, if two qubits are coupled via a resonator, or over a waveguide, but aren't proximate to one another surface codes can be used with the logically proximate qubits.

FIG. 13A is a flow-diagram illustrating an implementation of method 1300 to convert a state of a flying qubit, i.e. photon, into a state of a stationary qubit.

At 1302, the quantum information processor receives a photon at an optical structure, e.g., resonator. The photon could be in a waveguide such as an inter-qubit coupler, or a quantum communication channel such as channel 170 of system 100. The optical structure is optically coupled to a donor atom in a semiconductor substrate. In some implementations, the photon has a first quantum state.

At 1304, the quantum information processor creates a second quantum state in a donor atom in a semiconductor substrate. In some implementations, the photon has a second quantum state dependent upon the first quantum state, e.g., same as, corresponding to, mapping between states. That is, the quantum information processor is a photon memory. Here corresponding means the first state and the second state differ in basis states but align in amplitudes for the respective basis states.

FIG. 13B is a flow-diagram illustrating an implementation of method 1350 to convert the state of a stationary qubit into a state in a flying qubit.

At 1352, the quantum information processor creates a first quantum state in a donor atom in a semiconductor substrate. The donor atom is optically coupled to an optical structure, e.g., waveguide.

At 1354, the quantum information processor creates a second quantum state in a photon exiting the optical structure. In some implementations, the photon has a second quantum state dependent upon the first quantum state. That is, the quantum information processor can create a flying qubit. In some implementations, the photon enters an optical structure, such as, a waveguide, lens, or resonator.

Donor atoms can be used to emit photons communicatively coupled to a waveguide. In some implementations, the emission of photons can be triggered electrically. In some implementations, the emission of photons can be triggered optically. In some implementations, the emitted photons will be quantum-entangled with a plurality of donor atom qubits. In some implementations, the photons will not be entangled with any donor atom qubits.

A singly-ionized chalcogen donor atom has multiple excited electron orbital states, labelled akin to a bare hydrogen atom. These levels include 1s, 2s, and 2p. When in a silicon lattice, with six equivalent conduction band valleys, the 1s level is further split into twelve levels. Listed in decreasing binding energy, these are: two for the 1s:A ground state; two for the 1s:T2 (Γ7) level; four for the 1s:T2 (Γ8) level; and four for the 1s:E level. In some implementations, a donor atom, and electron thereby with a hydrogen-like orbit, can be pumped into a higher excited state such as 2p. From this excited state the electron undergoes a cascade process down to 1s:T2 (Γ7), from which it emits a photon to arrive at the ground state 1s:A. In this way the donor atom can act as a deterministic single-photon source. In some implementations, the donor atom is pumped directly into 1s:T2 (Γ7) and then after some characteristic delay the donor will emit a photon. In some implementations, the donor atom is coupled directly to a waveguide. In some implementations, the donor atom is coupled to a resonator which is in turn coupled to a waveguide. In some implementations, the coupled photonic structure matches multiple transition frequencies. In some implementations, the emitted photon qubit will possess a superposition of frequencies, polarizations, and/or spatial modes whose state is quantum entangled with the donor atom.

Spin to photon conversion: There are four electron transitions from 1s:A to 1s:T2 (Γ7). Two of these transitions are linearly polarized along the direction of an ambient magnetic field, and the other two transitions are negatively- and positively-circularly polarized. In some implementations, donor atom spin qubits are placed into linearly polarized optical cavities. An input spin superposition can then be transferred into a photon by exciting the atom. Once pumped into the excited state, it will later emit a photon in a superposition of frequencies matching the input spin state superposition. In some implementations, information encoded in the spin qubit is transferred into a spatial mode by placing donor atoms into chiral photonic components (e.g., a chiral waveguide) which directs opposing circularly-polarized photons into opposing spatial directions. The photon is then emitted into a superposition of paths corresponding to the input superposition spin state. In some implementations, a spin qubit superposition shifts the frequency of an optical resonator close to the path of an incident photon, which in turn directs, reflects, or phase-shifts the incident photon to entangle its state with that of the spin qubit. In some implementations, a frequency-matched photon is incident on a donor atom in a photonic structure where resonant light is absorbed and later re-emitted, and non-resonant photons simply reflected. The output photon is then time-bin entangled with the spin state of the qubit.

Photon to spin conversion: In some implementations, photon to spin conversion can happen by populating an optical structure (e.g., resonator) with a single photon. When a photon is present in an optical resonator, the available optical frequencies for the deep impurity (e.g., donor atom) change according to the Jaynes-Cummings model. This means that geometric operations can be performed on the electron spin selective upon the presence of a photon in the optical resonator, permitting photon to spin qubit conversion. In some implementations, photon to spin conversion can occur through strong non-resonant driving: a "virtual" process. If a single photon differs in frequency from a strong pump beam by exactly the energy separation of the electron spin, a single photon can be used to flip the electron spin conditional upon the frequency of the single input photon. In some implementations, an incoming photon qubit can undergo quantum teleportation into a spin qubit state. Quantum teleportation can be implemented by performing a parity measurement jointly upon an incoming photon and a secondary photon which is entangled with the donor spin qubit.

Purcell Loss: By coupling an optical structure (e.g., resonator) to a subset of the two spin ground states (e.g., one of two) Purcell Loss due to the optical structure or resonator is avoided. The state of quantum devices including qubit will eventually decay over characteristic time periods. Two common decay mechanisms are relaxation of amplitude or excitation with associated relation or $T_1$ time. The second is perturbation in phase with associated dephasing or $T_2$ time. Longer characteristic times allow information to be stored for longer or perform more quantum operations. Several factors may contribute to the decay mechanism. For a deep impurity in a semiconductor substrate, the substrate itself may be one source of decoherence. A resonance mode with frequency close to qubit frequency can cause the qubit to decay. This known as Purcell Loss.

As previously mentioned deep impurities (e.g., donor atoms) can be used to emit photons communicatively coupled to a waveguide. Consider again system 100 in FIG. 1. Quantum information processor 154 can emit a photon into quantum information channel 170, an example of a waveguide. Once an impurity or an optical structure included in quantum information processor 154 emits a photon, quantum information channel 170 can collect and transmit the photon. Examples of quantum information channel 170 include optical fiber (a.k.a., fiber optic) and free space.

The reverse process may happen. In some implementations, a frequency-matched photon incident on a deep impurity in an optical structure is absorbed. For example, a photon travelling via quantum information channel 170 can be emitted and directed to quantum information processor 154. The photon emitted from quantum information channel 170 can be collected by deep impurity or optical structure included in or on quantum information processor 154.

Quantum information processor 154 can be optically coupled to quantum information channel 170 in different ways. For example, optical coupling can be evanescently coupled. Consider FIG. 7 were a light source 710 sends light down waveguide 708 to interact with optical resonator 706. One or more parts of one or more surfaces of quantum information processor 154 or quantum information channel 170 can include an antireflective coating or film to more efficiently collect or transmit one or more photons. A part of the optical fiber may be coated with antireflective film, e.g., an extent of the entrance/exit pupil for the fiber. A lens could be disposed between quantum information channel 170 and quantum information processor 154. In some implementations, photons moving between quantum information processor 154 and quantum information channel 170 could be focused or directed by the lens.

Quantum information processor 154 and other parts of system 100 may be used as a single photon source. That is a deep impurity in quantum information processor 154 can act as a deterministic single-photon source. Single photon sources can be parts of vendible articles, vendible articles, or produce vendible articles, i.e., photons. In some implementations, a deep impurity included in quantum information processor 154 is pumped by a light source (e.g., included in quantum input subsystem 156) directly into 1s:T2 (Γ7) state and after some characteristic delay the impurity will emit a photon.

A single photon source can be in optical quantum cryptographic systems (QCSs) where, for example, a sender and receiver create shared secret information. When operating system 100 as a QCS, a sender transmits a stream of single photons to a receiver via quantum information channel 170. For example, system 100 sends photons to another device. Each photon encodes a bit of information. An eavesdropper intercepting the stream would interact with one or more photons. The state of these intercepted photons would be altered as would the information encoded by them. Therefore, the sender and receiver can determine if their communication has been intercepted and if not use the communication to create shared secret information.

Parts of system 100 may use shared secret information to create information used in the operation of machines, e.g., computing and communication machines. For example, system 100 could associated with a sender and create a cryptographic key, for example, a one-time pad by using the communication as a seed to a generator of the pad. For example, system 100 could be associated with a receiver and execute processor-executable instructions that define a key generation method, e.g., Blum Blum Shub method, Yarrow method, and the like. Parts of system 100, and a counterpart system (not shown in FIG. 1), may use shared secret information in a key agreement protocol for a virtual private network. Application instructions 126 includes processor-executable instructions which when executed causes system 100 to use parts of system 100 as a communications device, to generate a seed, key, nonce, hash, or the like.

Parts of system 100 single photon source may be used as a random number generator. A random number generator can be used to seed a pseudorandom number generator; to create initialization vectors, parameters for hash functions, nonces, salts, or keys; and the like. Digital computer 102 may interact with quantum information processor 154 via quantum input subsystem 156 and quantum output subsystem 158 to create one or more random numbers. Digital computer 102 may generate a signal including information that represents the one or more random numbers. Digital computer 102, via control subsystem 104, may cause the transmission of the information representing the one or more random numbers via network interface subsystem 110 and a network or non-network communication channel (not shown). The information representing the one or more random number may be sent via quantum information channel 170. Digital computer 102, via control subsystem 104, may cause the information that represents the one or more random numbers to be stored as processor readable information on the least one nontransitory computer- and processor-readable storage device 108.

Parts of system 100 including or operated as a single photon source may be used outside of random numbers and cryptography. A single photon source may be a low-noise source for optical devices, spectroscopy, and metrology. Many light sources emit photon at rate that randomly fluctuates limiting their utility. This uncertainty is known as jitter. A single photon source which produces photons at regular time intervals may have reduced jitter.

Consistent with exemplary systems, devices, methods, and articles herein a processor may cause information to be transmitted through a communications channel, e.g., optical fiber, fibers, network or non-network communication channel. It the case of a longer separation between sender and receiver or in the case of a networked communication channel it is useful to operate parts of system 100 as a quantum repeater. In some implementations, a quantum repeater provides photonic-to-atomic qubit interconversion. Examples of methods to interconvert stationary qubits (e.g., solid state) and flying qubits (e.g., photons) are described herein at, at least, FIGS. 9 and 13. In operation of a quantum repeater a state of a flying qubit, i.e. photon, is converted into a state of a stationary qubit. See for example, method 1300 illustrated in FIG. 13A. The state of the stationary qubit is then converted into a state of a flying qubit. See for example, method 1350 illustrated in FIG. 13B.

Exemplary systems and devices described herein may operate or be directed in accordance with methods developed in field of cavity quantum electrodynamics (cavity QED). Cavity QED concerns interaction of single atoms with single electromagnetic field modes, or pluralities of the same. Consider a two level atom interacting with a single electromagnetic field mode. The system may be modelled as the Hamiltonians for the non-interacting two-level atom, electromagnetic field mode, the interaction of the same, and a coupling of the same to an environment. Using the well-known approximations e.g., dipole and rotating wave, the Jaynes-Cummings Hamiltonian is analytically solvable. Further, the states of the Hamiltonian may be limited to four (4) states: the ground or excited state of the atom, and electromagnetic field mode including n or n+1 photons. The interaction with the environment can occur via spontaneous emission from the atoms or electromagnetic field mode. When the associated rates of decay are less than a single-photon Rabi frequency then coherent evolution may occur. Some quantum computers make use of coherent evolution as a computational resource.

Consider exemplary donor atom 204 of FIG. 2. Donor atom 204 may include singly-ionized donor 77Se+ and a single electron bound to the singly-ionized donor. At zero magnetic field, the hyperfine interaction splits the donor atom 204 ground-state spin levels into electron-nuclear spin singlet and triplet states. See FIG. 8. Of the many optical transitions available to donor atoms, excitation to the lowest excited state, 1s:T2:Γ7, has suitable properties. See discussion herein at, at least, FIG. 13. In some implementations, semiconductor material 202 is extends millimeters to tens of millimeters in three directions and comprises 28Si:77Se+ with residual 29Si at 75 parts per million, and donor density $5\times10^{-21}$ m$^{-3}$ for 77Se. Such a sample shows a transition 1s:A to/from 1s:Γ7 of 2.9 μm, an optical transition, and has well characterized linewidth of at most 0.007 cm$^{-1}$. In some implementations, information processor 200 may be modelled as a strong coupling between donor atom 204 and optical resonator 206. For example, donor atom 204 is a 77Se+ ion placed at mode maximum of optical resonator 206 with a resonance frequency matching the 1s:A to/from 1s:Γ7 transition for donor atom 204.

An environmental subsystem, such as environmental subsystem 152 may apply a magnetic field in a strength and direction to maximize coupling between donor atom 204 and optical resonator 206. For an information processor, like information processor 200, the transition frequencies between the multiple ground and excited states differ from one another in general, and shift according to an applied magnetic field. Thus the donor atom 204 and optical resonator 206 maybe selectively coupled or decoupled depending upon the spin state(s) of the atom.

When a magnetic field is applied the ground and excited spin states split with differing rates of divergence. See, FIG. 8 and note how the 1s:T2(Γ7), singlet, and triplet states (of 1s:A1 states) split (have different energy shown on axis 802) with different levels of applied magnetic field denoted on axis 804.

For an information processor, like information processor 200, the transition frequencies between the multiple ground and excited states differ from one another in general, and shift according to an applied magnetic field. Thus the donor atom 204 and optical resonator 206 maybe selectively coupled or decoupled depending upon the spin state(s) of the atom.

Resonance and selective coupling of deep impurities and optical structures (e.g., donor atom 204 and optical resonator 206) can be dynamically adjusted through the application of electric fields, magnetic fields, or mechanical strain. That is characteristics of individual impurities or optical structures, for example, their frequencies and coupling strengths, or interactions of the individual impurities or optical structures, can be controlled with magnetic fields, electric fields, or mechanical strain.

In some implementations, a quantum information processor includes one or more donor atoms with an optical transition. An exemplary donor is a non-gaseous stable chalcogen atom. The donor may have a nonzero nuclear spin, for example, some chalcogen nuclear isotopes have a nonzero spin, such as, 33S (spin-3/2), 77Se (spin-1/2) and 123Te and 125Te (both spin-1/2). These donor atoms' ground states have the same spin Hamiltonian as Group V (Group 15) donors, but with much larger hyperfine constants, A, of about 312 MHz, 1.66 GHz, 2.90 GHz, and 3.50 GHz respectively.

In some implementations, a deep impurity, and electron thereby may have a hydrogen like orbit, i.e., a '1s' hydrogenic manifold of 28Si:77Se+. When in a silicon lattice, with six equivalent conduction band valleys, the is level is further split into twelve levels.

In some implementations, a quantum information processor includes one or more donor atoms, that is, a double donor. When singly-ionized, a double donor has even larger binding energy (614 meV for S+, 593 meV for Se+, and 411 meV for Te+), and a hydrogenic (or He+) orbit structure with optical transitions in the mid-infrared (mid-IR'). In 28Si:77Se+ the optical transitions between the ground spin states to the lowest excited state are sufficiently narrow to be spin selective even at very low, or zero, magnetic field. Examples of non-gaseous stable chalcogen atoms include neutral, ionized, and doubly ionized atoms, e.g., $S^0$ (~300 meV), $Se^0$ (~300 meV), $Te^0$ (~300 meV), Se+ (593 meV), $S^+$ (614 meV), (593 meV), $Te^+$ (411 meV), $S^{++}$, $Se^{++}$, and $Te^{++}$. Just as singly-ionized charge state of deep donors can couple to optical structures, neutral (e.g., uncharged) charged deep double donors also admit suitably narrow optical transitions to excited states, and these transitions are similarly able to couple strongly to optical structures. Doubly-ionized atoms can be employed as nuclear spin qubits and proximate optical structures can interact with a doubly-ionized charge state. In some implementations, only one particular charge state is used to define qubits. In some implementations, a plurality of charge states is used to define qubits.

Examples of deep impurities include metallic clusters, such as, clusters of four atoms, e.g., $Cu_4$ (1014 meV), $Cu_3Ag$ (944 meV), $Cu_2Ag_2$ (867 meV), Cu3Pt (884 meV), $Cu_3Pt$ (882.36 meV), $Cu_2LiPt$ (850.1 meV), $CuLi_2Pt$ (827.6 meV), $Li_3Pt$ (814.9 meV), $Ag_4$ (778 meV), $Li_3Au$ (765.3 meV), $CuLi_2Au$ (746.7 meV), $Cu_3Au$ (735 meV), and $Cu_2LiAu$ (735.2 meV). Examples of a deep impurities include a metallic cluster, such as, clusters of five atoms, e.g., $CuLi_3$(Au) (1090.2 meV), $Cu_4Au$ (1066 meV), $Cu_3LiAu$ (1052.7 meV), $CuLi_2Ag$ (909.9 meV), $Cu_4Pt$ (777 meV), $Cu_2Li_2Pt$ (694.6 meV), $Cu_3LiPt$ (725.6 meV), and $CuLi_3Pt$ (671.6 meV). Examples of deep impurities include metallic atoms or metallic clusters selected from transition metals, e.g., clusters including copper, silver, gold, or platinum. In some implementations, a transition metal is a metal from the d-block or Groups 3 to 12 on the periodic table. In some implementations, a transition metal includes a metal selected from the f-block or lanthanide and actinide series.

Examples of deep impurities include Group I and II (Group 1 and 2) atoms or clusters, such as, a Group 2 double donor, e.g., $Mg^+$ (256.5 meV), $Mg^0$ (107.5 meV), and Be, or a Group 1 donor, e.g., $Li^0$ and $Li^+$. Examples of donors include compounds and cluster including those described herein above. Examples of donors include sulfur and copper, for example, the so called $S_A$ (968 meV) and $S_B$ (812 meV) centers.

As described herein a deep impurity, like donor atom 204, may have a transition in convenient wavelength corresponding to wavelength of commercially available optical emitters, lasers, detectors, mirrors, and the like. In some implementations, the wavelength corresponds to mid-IR wavelengths. Various implementations may include and make use of a laser that can emit light at a wavelength at or near the optical transitions of impurities included in semiconductor substrate. For example, quantum input subsystem 156 includes a light source. Various implementations may include and make use of a laser with variable wavelength or fixed wavelength. Suitable lasers for various implementations include the following types and wavelengths: AlGaInP (0.63-0.9 μm), vertical-cavity surface-emitting laser (VCSEL) (GaAs—AlGaAs) (0.6-1.3 μm), Nd:YAG (1.064-1.064 μm), VCSEL (0.85-1.5 μm), Cr:Mg2SiO4 (1.23-1.27 μm), InGaAs (1.1-1.7 μm), Raman (1-2 μm), InGaAsP (1-2.1 μm), AlGaIn/AsSb (~2 μm), Dye-Raman Shifted (0.9-4.5 μm), HF Chemical (2.7-2.9 μm), Cr:ZnSe/S (1.9-2.6 μm), XeHe (2-4 μm), Quantum Cascade Laser (2.63-250 μm), lead salt (3-20 μm), hybrid silicon (3-30 μm), GaInAsSb (3-30 μm), optical parametric oscillator (OPO) (3-1000 μm), and CO (doubled) (4.6-5.8 μm).

In some implementations, information stored in the states of a deep impurity is read out optically. The different electronic states, including different spin states, of a deep impurity in semiconductor substrate within an electric field are associated with different spin or charge distributions. These different distributions influence the properties of a proximate optical structure. Optical measurements (e.g., described herein at, at least, FIG. 7) on the proximate optical structure allows for measurement of the electronic state of a deep impurity.

Figure 14:
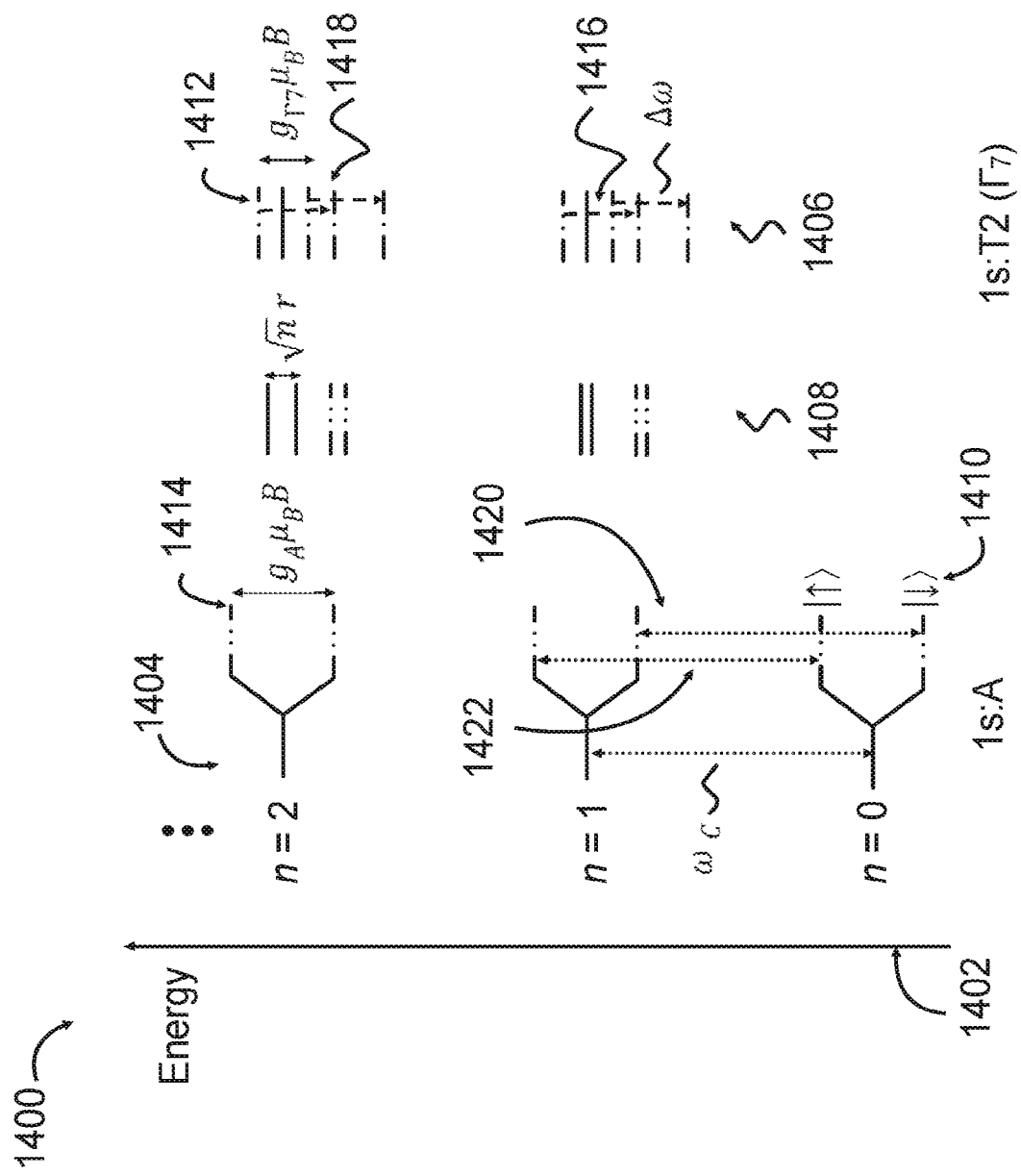
FIG. 14 schematically illustrates a plurality of energy levels for a coupled system including a deep impurity and an optical structure.

FIG. 14 schematically illustrates a plurality of energy levels 1400 in accordance with the present systems, devices, methods, and articles. The plurality of energy levels 1400 is plotted against an axis 1402 for energy. A series of excited states are plotted in the horizontal direction of FIG. 14. Plurality of energy levels 1400 includes Jaynes-Cummings ladder 1404 for a coupled system including a deep impurity and an optical structure. In Jaynes-Cummings ladder 1404, the numbers of photons in the optical structure are plotted. Note the levels continue after n=2. In Jaynes-Cummings ladder 1404, the level for one photon in the optical structure and two photons in the optical structure differ by the resonant frequency of the optical structure, $\omega_c$.

Jaynes-Cummings ladder 1404 allows for resonant transitions with aligned energy levels in between the 1s:A ground and 1s:Γ7 excited state. That is, if no effective magnetic field is applied to the deep impurity, then zero hyperfine interaction is present to split the ground state (e.g., the atom is a nuclear spin-zero isotope). The transitions are approximately the same energy. The constituent eigenstates hybridize. See for example solid lines for n=2 in Jaynes-Cummings ladder 1404 and energy levels for 1s:Γ7 excited state 1406. These match or substantially match for a resonant transition.

The controller may apply, via an input subsystem, a magnetic field to a deep impurity. When a magnetic field is applied to the deep impurity the states in Jaynes-Cummings ladder 1404 split into up and down spin states, e.g., down spin state 1410. The ground and excited spin states split with differing g-factors. See length scales at n=2 for the 1s:A and 1s:Γ7 states where the one splitting is half the other. In selenium-77 ground states split by $g_A \approx 2.01$ and while excited state ground 1s:Γ7 splits by $g_{Γ7} \approx 0.64$. In FIG. 14 the energy levels split and/or shifted under a magnetic field are denoted with long dash followed by two dots. For the 1s:Γ7 excited state 1406 the application of the magnetic field moves the state's energy levels. The energy levels in ground and excited state no longer match or substantially match. For example, the energy of state 1412 does not match energy of state 1414.

A controller, via an input subsystem, can tune the energy level of an excited state. The controller may shift the energy levels by Δw, see shifts 1416. The controller may shift the energy levels an excited state (e.g., 1s:Γ7 state) by applying or varying an electric field and/or strain to the semiconductor substrate. Devices to apply electric fields or strain to one or more parts of a semiconductor substrate are described herein in relation to, at least, FIGS. 1, 2, and 8. In FIG. 14 the energy levels shifted under an electric field or strain are denoted with long dash followed by one dot. Here after a shift of Δw energy levels align. For example, see levels at energy 1418. In FIG. 14 while the down state is shown in resonance see set of energy levels 1418 the up state could be brought in resonance. The controller may shift the energy levels an excited state to account for a mismatch between the transition frequency of a deep impurity and the resonant frequency of the optical structure.

The resulting strong-coupling condition is spin-dependent with energy levels 1408. Spin-dependent cavity coupling allows a controller via an output system to make a single-shot single-spin readout near or above 4.2 K. Spin-dependent optical structure coupling allows for readout without optical excitation of the impurity. For example in some implementations, if the deep impurity's electron spin is in the uncoupled ground state (e.g., up), the optical structure will transmit any light matching the resonant frequency of the optical structure—resonant light, here, ω$_C$. Conversely, if the electron spin is in the coupled ground state (e.g., down) the cavity will reflect resonant light at frequency, ω$_C$, since in this system configuration that frequency is no longer resonant. Transitions 1420 and 1422 illustrate part of the process. Transition 1420 is coupled. Transition 1422 is uncoupled.

In some implementations, when the deep impurity's electron spin is in the uncoupled ground state the optical structure will reflect resonant light. Conversely, when the electron spin is in the coupled ground state transmit resonant light. A large number of photons can be used to infer the optical structure's response without exciting a nonresonant transition in the deep impurity system or the coupled optical structure-deep impurity system.

Figure 15:
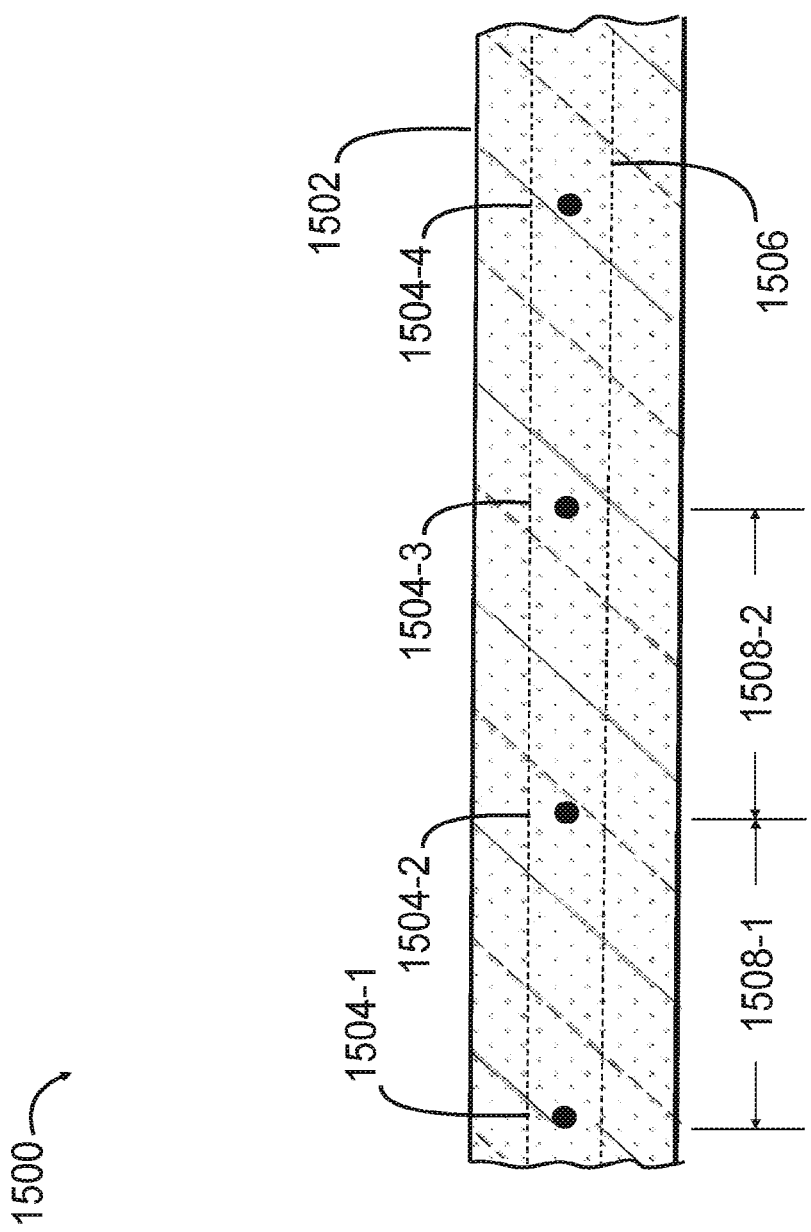
FIG. 15 is a schematic view illustrating a section of a quantum information processing device including a plurality of deep impurities optically coupled to a waveguide.

FIG. 15 is a schematic view illustrating a section of an exemplary part of a quantum information processing device 1500 including a plurality of deep impurities 1504 and a waveguide 1506. Quantum information device 1500 includes a semiconductor substrate 1502. The plurality of deep impurities 1504-1, 1504-2, 1504-3, 1504-4, and 1504-4 (collectively 1504) are disposed within semiconductor substrate 1502. Waveguide 1506, an example of an optical structure, supports a propagating mode able to support a plurality of propagating mode frequencies. Plurality of deep impurities 1504 are optically coupled to waveguide 1506 via the propagating mode. In the illustrated example, distances 1508-1 and 1508-2 are about the wavelength of the waveguide's mode, λ. Each deep impurity in plurality of deep impurities 1504 may be placed at or near an antinode of the propagating mode in waveguide 1506. Waveguide 1506 is a device which constrains or guides electromagnetic waves along a path defined by its physical structure. Waveguide 1516 may be defined within or upon substrate 1502. Light may propagate through waveguide 1516 and couple to plurality of deep impurities 1504-1, 1504-2, 1504-3, 1504-4, and 1504-4.

Further implementations are summarized in the following examples.

Example 1: A quantum information processing device comprising: a semiconductor substrate; one or more deep impurities disposed within the semiconductor substrate, wherein each of the deep impurities is characterized by a plurality of quantum states corresponding to different electron or nuclear spin states of the deep impurity and representing qubit information; one or more optical structures integrated with or coupled to the semiconductor substrate, each optical structure having a characteristic mode frequency and an optical state representing optical structure information; and a first deep impurity optically coupled to a first optical structure, the first deep impurity having a first transition frequency between a first pair of the plurality of quantum states, the first transition frequency matching a first characteristic mode frequency of the first optical structure, wherein the first optical structure optically couples the qubit information and the optical structure information.

Example 2: The device of example 1, wherein the characteristic mode frequency of the optical structure is a resonant mode frequency.

Example 3: The device of example 1, wherein the characteristic mode frequency of the first optical structure is a propagating mode frequency.

Example 4: The device of any of examples 1-2, wherein the first optical structure is a first optical resonator having a first photonic mode with the characteristic mode frequency as a first resonator frequency.

Example 5: The device of any of examples 1-4, wherein the first pair of the plurality of quantum states includes a first quantum state and a second quantum state, and the first transition frequency corresponds to an optical transition between first quantum state and a second quantum state in the plurality of quantum states.

Example 6: The device of any of examples 1-5, wherein the deep impurity is a non-gaseous chalcogen atom.

Example 7: The device of any of examples 1-6, wherein the device further comprises: a second optical structure having a second mode with a second characteristic mode frequency and a second deep impurity coupled to the second optical structure, the second deep impurity having a second transition frequency between a second pair of the energy levels, and the second transition frequency matches the second characteristic mode frequency.

Example 8: The device of example 7, wherein the second optical structure is at a distance from the first optical resonator, the distance being less than about twenty times a characteristic decay length, λ/n, where λ is the first photonic mode wavelength and n is the index of refraction of the semiconductor substrate.

Example 9: The device of any of examples 7 and 8, wherein: at least a portion of the second optical structure is interposed between the first deep impurity and second deep impurity, or the first deep impurity and second deep impurity are disposed within the second optical structure.

Example 10: The device of any of examples 1-9, further comprising a pair of electrodes placed astride the first optical structure to apply an electrical field to the first optical structure.

Example 11: The device of any of examples 1-10, further comprising a waveguide optically coupled to the first optical structure to optically probe an optical state of the first optical structure.

Example 12: A method of operation for a quantum information processor including one or more optical structures integrated with a semiconductor substrate, a plurality of deep impurities disposed in the semiconductor substrate, and wherein each of the deep impurities is characterized by a plurality of quantum states corresponding to different electron or nuclear spin states of the deep impurity and representing quantum information, the method comprising: initializing a first deep impurity in the plurality of deep impurities to a first fiducial state; initializing a second deep impurity in the plurality of deep impurities to the first fiducial state; causing an optical structure, proximate to the first deep impurity and the second first deep impurity, to be in resonance with the first deep impurity and the second first deep impurity; and measuring an optical state of the optical structure as a measure of the information represented by the quantum states of the first deep impurity and the second deep impurity.

Example 13: The method of example 12, wherein the first deep impurity is a double donor, and the method further comprises ionizing the first deep impurity to a singly-ionized state.

Example 14: The method of any of examples 12 and 13, wherein initializing the first deep impurity of the plurality of deep impurities further comprises initializing the first deep impurity of the plurality of deep impurities to at least one of: a nuclear spin state as a second fiducial state of the first deep impurity; an electron spin state as a third fiducial state of the first deep impurity; and a combined electron spin and nuclear spin state as a fourth fiducial state of the first deep impurity.

Example 15: The method of any of examples 12-14 wherein the optical structure is a first optical resonator has a first photonic mode with a first resonator frequency.

Example 16: The method of any of examples 12-15, wherein the optical structure is an optical waveguide having one or more propagation modes and frequencies carrying quantum information.

Example 17: The method of any of examples 12-16, wherein another optical structure is proximate to the second deep impurity, the method further comprising: tuning the other optical structure to be in resonance with the optical structure, the first deep impurity, and the second deep impurity.

Example 18: The method of any of examples 12-17, wherein causing the optical structure proximate to the first deep impurity and the second deep impurity, to be in resonance with the first deep impurity and the second deep impurity, further comprises: tuning the first deep impurity toward a transition frequency matching a resonance frequency of the optical structure.

Example 19: The method of any of examples 12-18, wherein causing the optical structure proximate to the first deep impurity and the second deep impurity, to be in resonance with the first deep impurity and the second deep impurity, further comprises: applying a magnetic field with a spatial gradient to the first deep impurity and the second deep impurity, wherein the magnetic field has a first value at the first deep impurity, and has a second value at the second deep impurity.

Example 20: The method of any of examples 12-19, wherein causing the optical structure proximate to the first deep impurity and the second deep impurity, to be in resonance with the first deep impurity and the second deep impurity, further comprises: applying a force to the semiconductor substrate to modify strain in the semiconductor substrate proximate to the optical structure.

Example 21: The method of any of examples 12-20, wherein causing the optical structure proximate to the first deep impurity and the second deep impurity, to be in resonance with the first deep impurity and the second deep impurity, further comprises: injecting a plurality of carriers into the semiconductor substrate proximate to the optical structure to electronically couple the first deep impurity and the second deep impurity.

Example 22: The method of any of examples 12-21, further comprising: applying a pulsed magnetic field to the first deep impurity to change a state of the first deep impurity.

Example 23: The method of any of examples 12-22, wherein measuring the state of the optical structure, further comprises: measuring for the presence or absence of a photon in the optical structure.

Example 24: The method of any of examples 12-22, wherein measuring the state of the optical structure, further comprises: measuring a frequency shift in a resonance frequency of the optical structure.

Example 25: A method of operation for a quantum information processor including a donor atom implanted in a semiconductor substrate, the method comprising: initializing the donor atom in a fiducial state; applying a pulsed electromagnetic field to change a state of the first donor atom; causing an optical structure proximate to the donor atom to be in optical resonance with the donor atom; and measuring a state of the optical structure.

Example 26: The method of example 25, wherein the donor atom is a double donor, the method further comprising: ionizing the donor atom to create a singly-ionized donor atom.

Example 27: The method of examples 25 or 26, further comprising: applying a positive voltage to an electrode overlying the semiconductor substrate and the donor atom to change a state of the donor atom.

Example 28: The method of examples 25-27, wherein the first donor atom has transition frequency, and causing the optical structure proximate to the donor atom to be in optical resonance with the first donor atom, further comprises: tuning the transition frequency of the first donor atom toward a frequency matching a resonance frequency of the optical structure.

Example 29: The method of any of examples 25-28, wherein causing the optical structure proximate to the donor atom to be in optical resonance with the first donor atom, further comprises: applying a force to the semiconductor substrate to modify a resonant geometry of the optical structure, or a transition frequency of the first donor atom.

Example 30: The method of any of examples 25-29, wherein causing the optical structure proximate to the donor atom to be in optical resonance with the first donor atom includes injecting a plurality of carriers into the semiconductor substrate proximate to the optical structure to modify a resonance frequency in the optical structure.

Example 31: The method of any of examples 25-30, wherein measuring the state of the optical structure further comprises: measuring for the presence or absence of a photon in the optical structure, or measuring a frequency shift in a resonance frequency of the optical structure.

Example 32: A method of operation for a quantum information processor including a deep impurity disposed in a semiconductor substrate, wherein the deep impurity has two or more different quantum states representing information. The method comprising: receiving a first photon with a first quantum state at an optical structure optically coupled to the deep impurity; and creating a second quantum state in the deep impurity dependent upon the first quantum state at the optical structure.

Example 33: The method of example 32, further comprising: creating, at the optical structure, a second photon with a third quantum state dependent upon the second quantum state in the deep impurity; and causing the second photon with the third quantum state to be emitted.

Example 34: The method of example 33, wherein causing the second photon with the third quantum state to be emitted, further comprises: optically or electrically triggering the second photon to be emitted.

Example 35: The method of example 32, wherein the quantum information processor is a photon memory.

Example 36: A method of operation for a quantum information processor including a deep impurity disposed in a semiconductor substrate, wherein the deep impurity has one or more different quantum states representing information, the method comprising: creating a first quantum state of the deep impurity in the semiconductor substrate; optically coupling the deep impurity to an optical structure; and creating, at the optical structure, a photon with a second quantum state dependent upon the first quantum state in the deep impurity.

Example 37: The method of example 36, further comprising: optically coupling the optical structure to a waveguide; and causing, at the optical structure, the photon with the second quantum state to be emitted into the waveguide.

Example 38: The method of example 37, wherein causing, the photon with the second quantum state to be emitted into the waveguide, further comprises: optically or electrically triggering the second photon to be emitted.

Example 39: The method of any of example 37 or 38, wherein the quantum information processor is a single-photon source.

Example 40: A quantum information processing system comprising: a processor-based device including at least one processor; a quantum information processor, wherein the quantum information processor includes a semiconductor substrate, a plurality of non-gaseous chalcogen donor atoms disposed within the semiconductor substrate, wherein a first respective donor atom in the plurality of non-gaseous chalcogen donor atoms has a first transition with a first transition frequency, and a plurality of optical resonators physically coupled the semiconductor substrate, wherein a first respective optical resonator in the plurality of optical resonators is selectively coupled to the first respective donor atom in the plurality of non-gaseous chalcogen donor atoms; and a plurality of communication lines providing communication between the processor based device and the quantum information processor.

Example 41: The system of example 40, wherein: the plurality of non-gaseous chalcogen donor atoms includes a second respective donor atom; the first respective optical resonator in the plurality of optical resonators has a first resonator frequency; the second respective donor atom in the plurality of non-gaseous chalcogen donor atoms is selectively coupled to the first respective optical resonator and has a second transition with a second transition frequency; and the first resonator frequency matches the first transition frequency and the second transition frequency.

Example 42: The system of examples 40 or 41, wherein: the plurality of optical resonators further includes a second respective optical resonator having a second resonator frequency; the second respective optical resonator is selectively coupled to the second respective donor atom in the plurality of non-gaseous chalcogen donor atoms; the second transition frequency matches the second resonator frequency; and the first resonator frequency matches the second resonator frequency.

Example 43: The system of any of examples 40-42, wherein the first respective donor atom in the plurality of non-gaseous chalcogen donor atoms is disposed at a depth greater than ten nanometers in the semiconductor substrate.

Example 44: The system of any of examples 40-43, wherein the first respective donor atom in the plurality of non-gaseous chalcogen donor atoms is a deep level donor with an ionization energy that is substantially greater than the thermal energy, $k_BT$, at room temperature.

Example 45: The system of any of examples 40-44, further comprising an environment subsystem controlling parameters of an environment in which the quantum information processor operates, the parameters including one or more of moisture, air pressure, vibration, magnetic field, temperature, and electromagnetic fields.

Example 46: The system of any of examples 40-45, further comprising: at least one classical communication channel in communication with the at least one processor; and a network interface subsystem, which when operating supports bidirectional communication of processor-readable data through the at least one classical communication channel.

Example 47: The system of any of examples 40-46, further comprising: a waveguide optically coupled to the first respective non-gaseous chalcogen donor atom in the plurality of non-gaseous chalcogen donor atoms disposed within the semiconductor substrate.

Example 48: The system of any of examples 40-47, wherein the first respective non-gaseous chalcogen donor atom in the plurality of non-gaseous chalcogen donor atoms has a plurality of energy levels or states identified as electronic spin states, nuclear spin states and combined electronic and nuclear spin states, and wherein a selected pair of the plurality of energy levels or states is designated as a pair of computational states of the first respective non-gaseous chalcogen donor atom.

Example 49: The system of any of examples 40-48, wherein: the first respective non-gaseous chalcogen donor atom in the plurality of non-gaseous chalcogen donor atoms includes a pair computational states; and the pair of computational state is selected from the group consisting of: a first value for a nuclear spin state of the first respective non-gaseous chalcogen donor atom and a second value for the nuclear spin state of the first respective non-gaseous chalcogen donor atom; a first value for an electronic spin state of the first respective non-gaseous chalcogen donor atom and a second value for the electronic spin of the first respective non-gaseous chalcogen donor atom; and a first value for a nuclear spin and an electronic spin of the first respective non-gaseous chalcogen donor atom, and a plurality of values for the nuclear spin and the electronic spin of the first respective non-gaseous chalcogen donor atom, wherein the first value for the nuclear spin and the electronic spin is a singlet state, and the a plurality of values for the nuclear spin and the electronic spin of the respective non-gaseous chalcogen donor atom is triplet state.

Example 50: The system of any of examples 40-49, further comprising a quantum input subsystem in communication with the at least one processor and quantum information processor.

Example 51: The system of example 50, wherein the quantum input subsystem includes a pair of electrodes proximate to the first respective non-gaseous chalcogen donor atom disposed within the semiconductor substrate; and wherein the at least one processor causes the quantum input subsystem to apply an electric field to the first respective non-gaseous chalcogen donor atom disposed within the semiconductor substrate, via the plurality of communication lines and the pair of electrodes.

Example 52: The system of any of examples 50-51, wherein the quantum input subsystem includes: a pair of electrodes disposed proximate to one or more parts of quantum information processor; and wherein the at least one processor causes the quantum input subsystem to change a number of electrical carriers to one or more parts of quantum information processor via the plurality of communication lines and the pair of electrodes.

Example 53: The system of any of examples 50-52, wherein the one or more parts of quantum information processor include the first respective optical resonator in the plurality of optical resonators.

Example 54: The system of any of examples 50-53, wherein the one or more parts of quantum information processor includes the first respective non-gaseous chalcogen donor atom in the plurality of non-gaseous chalcogen donor atoms disposed within the semiconductor substrate.

Example 55: The system of any of examples 50-54, wherein the quantum input subsystem includes an electromagnet proximate to the quantum information processor; and wherein the at least one processor causes, via the plurality of communication lines, the quantum input subsystem to apply a magnetic field to one or more parts of quantum information processor via the plurality of communication lines and the electromagnet.

Example 56: The system of any of examples 40-55, wherein: the one or more parts of quantum information processor includes the plurality of non-gaseous chalcogen donor atoms disposed within the semiconductor substrate; and the magnetic field includes a spatial gradient over a spatial extent for the plurality of non-gaseous chalcogen donor atoms.

Example 57: The system of example 56, wherein the magnetic field changes the first transition and the first transition frequency for the first respective donor atom in the plurality of non-gaseous chalcogen donor atoms.

Example 58: The system of any of examples 40-57, wherein: the plurality of non-gaseous chalcogen donor atoms includes a plurality of nuclear spins; the first respective non-gaseous chalcogen donor atom in the plurality of non-gaseous chalcogen donor atoms includes a first respective nuclear spin of the plurality of nuclear spins; the first respective nuclear spin includes a first nuclear resonance frequency; and the magnetic field is applied a transverse direction for the first respective nuclear spin of the plurality of nuclear spins with a sinusoidal temporal oscillation at a rate corresponding to the nuclear resonance frequency.

Example 59: The system of any of examples 40-58, further comprising: a device of variable length embedded in the semiconductor substrate, wherein the at least one processor causes the device of variable length to change length effect a strain on a proximate region of the semiconductor substrate, via the quantum input subsystem and the plurality of communication lines.

Example 60: The system of any of examples 40-59, wherein the proximate region of semiconductor substrate includes at least one of: the first respective non-gaseous chalcogen donor atom in the plurality of non-gaseous chalcogen donor atoms disposed within the semiconductor substrate; and the first respective optical resonator in the plurality of optical resonators selectively coupled to the first respective donor atom in the plurality of non-gaseous chalcogen donor atoms.

Example 61: The system of any of examples 40-60, wherein the device of variable length is a piezoelectric material device or a micro-electro-mechanical system.

Example 62: The system of any of examples 40-61, wherein the at least one processor causes the quantum input subsystem to apply one or more magnetic resonance control operations to one or more non-gaseous chalcogen donor atoms in the plurality of non-gaseous chalcogen donor atoms disposed within the semiconductor substrate.

Example 63: The system of any of examples 40-62, wherein the one more magnetic resonance control operations include one or more of: an electron spin resonance operation; a nuclear magnetic resonance operation; a single qubit operation; and a multi-qubit operation.

Example 64: The system of any of examples 40-63, further comprising a quantum output subsystem in communication with the at least one processor.

Example 65: The system of any of examples 40-64, wherein the at least one processor causes the quantum output subsystem to measure a state of one or more non-gaseous chalcogen donor atoms in the plurality of non-gaseous chalcogen donor atoms disposed within the semiconductor substrate.

Example 66: The system of any of examples 40-65, wherein the quantum output subsystem includes an optical measurement device, and the at least one processor causes the optical measurement device to measure a state of the first respective optical resonator in the plurality of optical resonators physically coupled the semiconductor substrate.

Example 67: The system of any of examples 40-66, wherein the optical measurement device measures a frequency shift of the first resonator frequency of the first respective optical resonator in the plurality of optical resonators physically coupled the semiconductor substrate.

Example 68: The system of any of examples 40-67, wherein the optical measurement device measures a presence or absence of a photon in the first respective optical resonator in the plurality of optical resonators physically coupled the semiconductor substrate.

Example 69: An information processing device comprising: a semiconductor substrate; a first deep impurity disposed within the semiconductor substrate, wherein the first deep impurity has a first basis state, a second basis state, and an optical transition between the first basis state and the second basis state; and a first optical structure physically coupled the semiconductor substrate optically coupled to the first deep impurity.

Example 70: The device of example 69, wherein the deep impurity has an ionization energy that is substantially greater than the thermal energy, $k_BT$, at room temperature.

Example 71: The device of examples 69 or 70, wherein the deep impurity is a stable non-gaseous chalcogen atom.

Example 72: The device of any of example 71, wherein the stable non-gaseous chalcogen atom is a sulfur atom, a selenium atom, or a tellurium atom.

Example 73: The device of any of examples 69-72, wherein the deep level donor is a metallic atom or a metallic cluster.

Example 74: The device of any of example 73, wherein the metallic atom is a transition metal element.

Example 75: The device of any of example 73, wherein the metallic atom is a lithium atom, beryllium atom, or a magnesium atom.

Example 76: The device of any of example 73, wherein the metallic cluster is composed essentially of four atoms or five atoms.

Example 77: The device of any of examples 73 or 76, wherein the metallic cluster includes one or more atoms selected from the group consisting of copper, silver, gold, and platinum.

Example 78: The device of any of examples 69-73, 76, or 77, wherein the deep impurity includes copper and sulfur.

Example 79: The device of any of examples 69-73, 76, 77, or 78, wherein the deep impurity is an $S_A$ center or an $S_B$ center.

Example 80: The device of any of examples 69-79, wherein the semiconductor substrate is made of silicon including more than 95% non-paramagnetic isotopes of silicon.

Example 81: The device of any of examples 69-80, wherein the semiconductor substrate includes silicon carbide or silicon germanium.

Example 82: The device of any of examples 69-81, wherein the first basis state or the second basis state are electronic spin states, nuclear spin states and combined electronic and nuclear spin states.

Example 83: The device of any of examples 69-82, further comprising an acceptor disposed with the semiconductor substrate.

Example 84: The device of any of examples 83, wherein the acceptor is boron, aluminum, gallium, or indium.

Unless otherwise specified herein, or unless the context clearly dictates otherwise the term about modifying a numerical quantity means plus or minus ten (10) percent. Unless otherwise specified, or unless the context dictates otherwise, between two numerical values is to be read as between and including the two numerical values.

In the above description, some specific details are included to provide an understanding of various disclosed implementations. One skilled in the relevant art, however, will recognize that implementations may be practiced without one or more of these specific details, parts of a method, components, materials, etc. In some instances, well-known structures associated with semiconductor and/or optical devices and/or quantum computing and/or quantum information processing, such as targets, substrates, lenses, waveguides, shields, filters, lasers, processor-executable instructions (e.g., BIOS, drivers), have not been shown or described in detail to avoid unnecessarily obscuring descriptions of the disclosed implementations.

In this specification and appended claims "a", "an", "one", or "another" applied to "embodiment", "example", or "implementation" is used in the sense that a particular referent feature, structure, or characteristic described in connection with the embodiment, example, or implementation is included in at least one embodiment, example, or implementation. Thus, phrases like "in one embodiment", "in an embodiment", or "another embodiment" are not necessarily all referring to the same embodiment. Furthermore, the particular features, structures, or characteristics may be combined in any suitable manner in one or more embodiments, examples, or implementations.

As used in this specification and the appended claims, the singular forms of articles, such as "a", "an", and "the", include plural referents unless the context mandates otherwise. It should also be noted that the term "or" is generally employed in its sense including "and/or" unless the context mandates otherwise.

Unless the context requires otherwise, throughout this specification and appended claims, the word "comprise" and variations thereof, such as, "comprises" and "comprising" are to be interpreted in an open, inclusive sense, that is, as "including, but not limited to".

All of the US patents, US patent application publications, US patent applications, foreign patents, foreign patent applications, and non-patent publications referred to in this specification, or referred to on any application data sheet including U.S. Provisional Application Ser. No. 62/260,391 (filed 2015 Nov. 27), are incorporated by reference in their entireties for all purposes herein.

While certain features of the described embodiments and implementations have been described herein, many modifications, substitutions, changes and equivalents will now occur to those skilled in the art. It is, therefore, to be understood that the appended claims are intended to cover all such modifications and changes as fall within the scope of the described embodiments and implementations.

The invention claimed is:

1. An information processing device comprising:
   a semiconductor substrate;
   a deep impurity disposed within the semiconductor substrate, the deep impurity having a plurality of spin-selective optical transitions;
   an optical structure coupled to the semiconductor substrate and having one or more photonic modes;
   a controller configured to manipulate a quantum state of the deep impurity by applying at least one of a magnetic field, an electric field, or a mechanical strain to the semiconductor substrate to cause a subset of the spin-selective optical transitions of the deep impurity to couple to a first one of the photonic modes of the optical structure;
   an optical detector; and
   a quantum information channel arranged to collect photons from the optical structure and carry the photons to the optical detector, wherein the optical detector is configured to determine the number of photons received from the quantum information channel and infer the quantum state of the deep impurity based on the number of photons.

2. The information processing device of claim 1 wherein the deep impurity has a quantum state comprising a superposition of a first quantum basis state and a second quantum basis state wherein the first and second quantum basis states respectively comprise distinct first and second ground spin states of the deep impurity, each of the first quantum basis state and the second quantum basis state having a non-zero electron spin wherein the deep impurity has an excited state and the spin-selective optical transitions are transitions between the ground states and the excited state.

3. The information processing device according to claim 1, wherein the optical detector is configured to infer the quantum state of the deep impurity based on an optical intensity of the photons.

4. The information processing device according to claim 1, wherein the quantum information channel comprises a chiral waveguide which directs oppositely circularly-polarized photons into opposing spatial directions such that the photons are emitted into a superposition of paths corresponding to a superposition spin state of the deep impurity.

5. The information processing device according to claim 1 wherein the photonic mode of the optical structure is dependent on the quantum state of the deep impurity.

6. The information processing device according to claim 1 comprising a light source configured to direct photons into the optical structure.

7. The information processing device according to claim 6 wherein a frequency of the photons from the light source matches the frequency of the photonic mode of the optical structure.

8. The information processing device according to claim 7 wherein the deep impurity is operative to absorb and later re-emit resonant photons and non-resonant photons are reflected such that after the frequency-matched photons interact with the deep impurity output photons are time-bin entangled with a spin state of the deep impurity.

9. The information processing device according to claim 1 wherein the optical detector is configured to infer the quantum state of the photons received from the quantum information channel by detecting changes in properties of the photons.

10. The information processing device according to claim 9 wherein the properties of the photons include at least one of: optical polarization, number of photons, optical intensity, relative indistinguishability of multiple photons, optical frequency, time of detection, and spatial distribution of the photons.

11. The information processing device according to claim 1 comprising two or more of the deep impurities optically coupled to the optical structure wherein the controller is configured to infer a parity of spin states of the two or more deep impurities by based on measuring the optical frequency or other optical characteristics of the optical structure.

12. The information processing device according to claim 1 comprising two or more of the deep impurities optically coupled to the optical structure wherein each of the deep impurities is characterized by a plurality of quantum states corresponding to different electron or nuclear spin states of the deep impurity and the controller is configured to initialize a first one of the deep impurities to a first fiducial state; initialize a second one of the deep impurities to the first fiducial state; cause the optical structure to be in resonance with the first and second ones of the deep impurities; and measure an optical state of the optical structure as a measure of the information represented by the quantum states of the first and second ones of the deep impurities.

13. The information processing device according to claim 1 wherein the controller is configured to cause a light source to transmit light onto the optical structure and to infer a quantum state of the deep impurity based on data regarding reflection and/or absorption of the transmitted light.

14. The information processing device according to claim 13 wherein light source is operative to emit black body light with non-trivial spectral density at a resonance of the optical structure.

15. The information processing device according to claim 1 comprising one or more electrodes proximate the optical structure and the deep impurity and a control subsystem operative to tune the deep impurity by injection of electrical carriers via electrodes proximate to the optical structure.

16. The information processing device according to claim 1, wherein the deep impurity has an ionization energy that is substantially greater than the thermal energy, $k_B T$, where $k_B$ is Boltzmann's constant and T is room temperature.

17. The information processing device according to claim 1 wherein the deep impurity is located at an antinode of the photonic mode of the optical structure.

18. The information processing device according to claim 1 wherein the semiconductor substrate includes silicon carbide or silicon germanium.

19. The information processing device according to claim 1, wherein the semiconductor substrate is made of silicon including more than 95% non-paramagnetic isotopes of silicon.

20. The information processing device according to claim 1, comprising a subsystem operative to electrically or optically trigger the deep impurity to emit photons.

* * * * *